US008645895B2

(12) United States Patent
Bergmann et al.

(10) Patent No.: US 8,645,895 B2
(45) Date of Patent: Feb. 4, 2014

(54) CHECKING AN ESD BEHAVIOR OF INTEGRATED CIRCUITS ON THE CIRCUIT LEVEL

(75) Inventors: Lars Bergmann, Erfurt (DE); Angela Konrad, Erfurt (DE); Markus Frank, Erfurt (DE)

(73) Assignee: X-Fab Semiconductor Foundries AG, Erfurt (DE)

( * ) Notice: Subject to any disclaimer, the term of this patent is extended or adjusted under 35 U.S.C. 154(b) by 284 days.

(21) Appl. No.: 12/742,956

(22) PCT Filed: Dec. 4, 2008

(86) PCT No.: PCT/EP2008/066838
§ 371 (c)(1),
(2), (4) Date: Aug. 13, 2010

(87) PCT Pub. No.: WO2009/071646
PCT Pub. Date: Jun. 11, 2009

(65) Prior Publication Data
US 2011/0016440 A1    Jan. 20, 2011

(30) Foreign Application Priority Data

Dec. 4, 2007    (EP) .................................. 07122324

(51) Int. Cl.
*G06F 17/50*    (2006.01)
(52) U.S. Cl.
USPC .......................................... 716/136; 716/106
(58) Field of Classification Search
USPC .......................... 716/106, 111, 112, 116, 136
See application file for complete search history.

(56) References Cited

U.S. PATENT DOCUMENTS

| 5,796,638 | A  | * | 8/1998 | Kang et al. ..................... 716/112 |
| 6,700,385 | B2 | * | 3/2004 | Kraz .............................. 324/457 |
| 6,930,501 | B2 | * | 8/2005 | Bargstadt-Franke et al. ......................... 324/750.3 |
| 7,024,646 | B2 |   | 4/2006 | Logie et al. |
| 2002/0144213 | A1 |   | 10/2002 | Ramaswamy et al. |
| 2004/0243949 | A1 |   | 12/2004 | Wang et al. |
| 2007/0165344 | A1 |   | 7/2007 | Esmark et al. |
| 2007/0277138 | A1 |   | 11/2007 | Lai et al. |

FOREIGN PATENT DOCUMENTS

| DE | 10339924 A1 | 4/2005 |
| GB |  2400462 A  | 10/2004 |

OTHER PUBLICATIONS

Paul Ngan, Robert Gramacy, Ching-Kwok Wong, Dan Oliver, Theo Smedes: Automaic Layout Based Verification of Electrostatic Discharge Paths; EOS/ESD Symposium Proceedings 2001.

Snehamay Sinha, Hemalata Swaminathan, Gopalarao Kadamati, Charvaka Duvvury: An Automated Tool for Detecting ESD-Design Errors; EOS/ESD Symposium Proceedings 1998, pp. 3A.7.1 to 3A.7.10.

(Continued)

*Primary Examiner* — Vuthe Siek
(74) *Attorney, Agent, or Firm* — Duane Morris LLP

(57) ABSTRACT

A system and a method for testing the ESD behavior, wherein a circuit (7) is automatically tested at circuit diagram level in that technology-specific ESD data is provided in database (2) for each circuit component present in the circuit, without requiring complex circuit simulations, for example based on front end or back end data, by taking into account the layout.

20 Claims, 12 Drawing Sheets

(56) References Cited

OTHER PUBLICATIONS

R. Y. Zhan, H. G. Feng, Q. Wu, G. Chen, X. K. Guan, Albert Z. Wang: A Technology-Independent CAD Tool for ESD Protection Device Extraction—ESDExtractor, IEEE Transactions on Computer-Aided Design of Integrated Circuits and Systems, vol. 22, No. 10, Oct. 2003.
M. Streibl, F. Zaengl, K. Esmark, R.Schwencker, W. Stadler, H. Gossner, S. Drueen, D. Schmitt-Landsiedel: High Abstraction Level Permutational ESD Concept Analysis; EOS/ESD Symposium Proceedings 2003.
Michael Baird, Richard Ida: VerifyESD: A tool for efficient circuit level ESD-simulations of mixed-signal IC's; EOS/ESD Symposium Proceedings 2000, pp. 4A.8.1 to 4A.8.5.
Stephen G. Beebe: Simulation of Complete CMOS I/O Circuit Response to CDM Stress; EOS/ESD-Symposium Proceedings 1998, pp. 4A.1.1 to 4A.1.12.
Horst Gieser: Verfahren zur Charakterisierung von integrierten Schaltungen mit sehr schnellen Hochstromimpulsen; Aachen: Shaker Verlag, 1999, ISBN 3-8265-6584-3.
T. J. Maloney, N. Khurana: Transmission Line Pulsing Techniques for Circuit Modeling of ESD Phenomena; EOS/ESD Symposium Proceedings 1985, pp. 49 to 54.
Rouying Zhan, Haolu Xie, Haigang Feng, Albert Wang: ESDZapper: A new layout-level verification tool for finding critical discharging path under ESD stress, Design Automation Conference, 2005, Proceedings of the ASP-DAC 2005, Asia and South Pacific Shanghai, China Jan. 2005, Piscataway, NJ, USA, IEEE, vol. 1, Jan. 18, 2005, pp. 79 to 82, XP010814307, ISBN: 978-0-7803-8736-2.
R. Y. Zhan, H. G. Feng, Q. Wu, X. K. Guan, G. Chen, H. L. Xie, A. Z. Wang: Concept and extraction method of ESD-critical parameters for function-based layout-level ESD protection circuit design verification, Design Automation Conference, 2004. Proceedings of the ASP-DAC 2004. Asia and South Pacific Yokohama, Japan Jan. 27-30, 2004, Piscataway, NJ, USA, IEEE, Jan. 27, 2004, pp. 710 to 712, XP010726669, ISBN: 978-0-7803-8175-9.
Ciaran J. Brennan, Joseph Kozhaya, Robert Proctor, Jeffrey Sloan, Shunhua Chang, James Sundqist, Terry Lowe, David Picozzi: ESD design automation & methodology to prevent CDM failures in 130 & 90nm ASIC design systems, of Electrostatics, Elsevier Science Publishers B.V. Amsterdam, NL, vol. 64, No. 2, Feb. 1, 2006, pp. 112 to 127, XP005194563, ISSN: 0304-3886.
Rouying Zhan, Haigang Feng, Qiong Wu, Haolu Xie, Xiaokang Guan, Guang Cheng, Albert Z. H. Wang: ESDInspector: A New Layout-Level ESD Protection Circuitry Design Verification Tool Using a Smart-Parametric Checking Mechanism, IEEE Transactions on Computer Aided Design of Intergrated Circuits and Systems, IEEE Service Center, Piscataway, NJ, US, vol. 23, No. 10, Oct. 1, 2004, pp. 1421 to 1428, XP011119079 ISSN: 0278-0070.
James Di Sarro, Kiran Chatty, Robert Gauthier, Elyse Rosenbaum: Evaluation of SCR-Based ESD Protection Devices in 90nm and 65nm CMOS Technologies, Physics Symposium, 2007, Proceedings, 45th Annual IEEE International, IEEE, PI, Apr. 1, 2007, pp. 348 to 357, XP031175096, ISBN: 978-1-4244-0918-1.
Z. Piatek, J. F. Kolodziejski, W. A. Pleskacz: ESD Failures of Integrated Circuits and Their Diagnostics Using Transmission Line Pulsing, Design and Diagnostics of Electronic Circuits and Systems, 2007, DDECS '07, IEEE, IEEE, PI, Apr. 11, 2007, pp. 1 to 5, XP031215942, ISBN: 978-1-4244-1161-0.
Hugh Hyatt, Jay Harris, Andre Alonzo, Patrick Bellew: TLP Measurements for Verification of ESD Protection Device Response, IEEE Transactions on Electronics Packaging Manufacturing, IEEE, Piscataway, NJ, US, vol. 24, No. 2, Apr. 1, 2001, pp. 90 to 98, XP011020065, ISSN: 1521-334X.
Harald Gossner: ESD protection for the deep sub micron regime—a challenge for design methodology, VLSI Design, 2004, Proceedings, 17th International Conference on Mumbai, India Jan. 5-9, 2004, Los Alamitos, CA, USA, IEEE Comput. Soc, US, Jan. 5, 2004, pp. 809 to 818, XP010679102, ISBN: 978-0-7695-2072-8.
Ming-Dou Ker, Jia-Huei Chen: Self-Substrate-Triggered Technique to Enhance Turn-On Uniformity of Multi-Finger ESD Protection Devices, IEEE Journal of Solid-State Circuits, IEEE Service Center, Piscataway, NJ, US, vol. 41, No. 11, Nov. 1, 2006, pp. 2601 to 2609, XP011149857, ISSN: 0018-9200.
M. Streibl, F. Zaengl, K. Esmark, R. Schwencker, W. Stadler, H. Gossner, S. Drueen, D. Schmitt-Landsiedel: High Abstraction Level Permutational ESD Concept Analysis, Microelectronics and Reliability, Elsevier Science Ltd., GB, vol. 45, No. 2, Feb. 1, 2005, pp. 313 to 321, XP004708570, ISSN: 0026-2714.
Alonso Nogueiro; European Search Report for EP 07 12 2324—mailed May 27, 2008.
Alonso Nogueiro; Extended European Search Report for EP 07 12 2324—mailed Dec. 5, 2008.
Alonso Nogueiro; International Search Report for PCT/EP 20081066838—mailed Jun. 22, 2009.

\* cited by examiner

CHECKING AN ESD BEHAVIOR OF INTEGRATED CIRCUITS ON THE CIRCUIT LEVEL

CROSS-REFERENCE TO RELATED PATENT APPLICATIONS

The present application is a U.S. national stage application under 35 U.S.C. §371 of PCT Application No. PCT/EP2008/066838, filed Dec. 4, 2008, the entirety of which is incorporated herein by reference.

The invention relates to the fabrication of integrated circuits and more particularly to the evaluation of various signal paths of the integrated circuit in an early phase of the fabrication. The early phase is prior to realising a physical layout. The testing is made with respect to the behaviour of "the circuit diagram" upon occurrence of static discharges (ESD, electro static discharge).

A superior design robustness and efficiency in the development of integrated circuits are crucial factors for the competitiveness of semiconductor manufactures. A fully operational first device is essential in a global competition. For circuits used in safety-critical or safety relevant applications, e.g. in the automotive industry or in medical engineering, a complete validation of the functionality is necessary. In this respect, for example, overvoltages that exceed the normal operating conditions must not result in a malfunction or a total failure.

The increasing integration of more and more functions and the reduction of chip floor space make integrated circuits more sensitive to damage caused by electro static discharge. In integrated circuits or other devices of the micro technology, in which circuit elements and signal paths for electric signals are present, conductive semiconductor region in the form of PN junctions, lines and the like, metal regions, insulators, etc. are arranged within very small regions in order to form the devices required for the circuit, for instance, transistors, capacitors, resistors or/and the like. For example, in MOS technology field effect transistors are used, which comprise two highly doped semiconductor regions which in turn are separated from each other by a weakly doped channel region. The conductivity of the channel region is controlled by an electrode that is usually referred to as gate electrode and that is separated from the channel region by an insulation layer. Upon a further scaling of the transistor dimensions also the thickness of this insulation layer is to be reduced in order to preserve the controllability of the channel region in the required manner, even at the reduced dimensions.

Upon reducing the thickness of the insulation material also the capability is reduced to withstand higher voltages without breakdown. Such gate dielectrics are thus particularly vulnerable with the occurrence of increased voltages. This holds true in a more or less pronounced manner also for the other devices in integrated circuits, since due to the ongoing reduction of the device area necessarily the length of respective isolation distances, such as the thickness of the gate dielectrics, is also reduced.

For this reason the sensitivity of devices in advanced integrated circuits with respect to the occurrence of overvoltages increases, whose occurrence is partially inevitable upon handling integrated circuits. Even static charges of a human being, generated by friction, for instance upon walking on carpeted floor and the like, may reach a magnitude of several 1000 V, wherein the accumulated charge can then drain off upon contact with a conductive path, or these charges can discharge as an electric breakdown by generating a conductive path due to a non-sufficient dielectric strength of the insulating distance. Despite of the relatively low amount of involved charges during such an electrostatic discharge or ESD relatively high currents can flow, since the discharge currents emerge within very short time intervals of a few nano seconds (nsec) up to some ten nano seconds or up to several hundred nano seconds only.

For characterizing such discharge events corresponding models have been defined that describe the conditions emerging during static discharges. By means of these models the behaviour of integrated circuits may be quantitatively examined and determined for the respective conditions that are represented by the specific model. For example, there is a model for static discharges that occur when charging a person, wherein the electric parameters, such as the voltage range, the internal resistance, duration and amount of the discharge current, are set to values, which substantially reflect such discharge events when statically charging persons.

Thus, in an electrostatic discharge across an integrated circuit damage may be caused that result in an irreversible damage of an insulation layer, in a thermal damage owing to the high current or a gradual change of the device behaviour due to, for instance, increased leakage currents, in particular, when these discharges occur more frequently. These types of damage may also occur in any combination.

The strength against overvoltages is a release relevant parameter in the development of integrated circuits. The insufficient strength against overvoltages is frequently the reason for delays in the development of circuits, which leads to dramatically increased development costs due to required revisions.

For this reason there is a growing demand for increased ESD robustness or ESD strength. ESD damage and the failures associated therewith are frequently the reason for re-designs. Upon identifying an ESD weak spot the design of the integrated circuit has to be changed in order to achieve an ESD robustness that is appropriate for the application. By implementing known ESD protection concepts by means of the ESD protection structures provided by the semiconductor technologies, for instance, in the form of devices, such as specific transistors, diodes, etc. that can drain off the high currents within short time intervals without damage, it is presently possible to ensure the required high ESD strength at circuit level even for ESD sensitive circuits. The condition therefor is, however, the correct implementation of the ESD protection concepts and the fulfillment of the ESD design rules defined for the technology. The ESD design rules or the design prescriptions specify the processes and materials as well as corresponding dimensions, which are to used for the specific technology in order to be able to achieve the required ESD strength. To this end, also the required ESD protection concepts, i.e., the circuit elements that provide appropriate ESD discharge paths, have to be efficiently implemented in the circuit configuration. Therefore, a thorough validation specifically of the highly complex circuits in mixed signal applications is necessary. These are applications in which analog circuits and digital circuits are present in one circuit arrangement and are used in automotive applications, for instance in the filed of vehicles.

One essential task in the design flow during the development of integrated circuits, e.g., according to FIG. 1a, is thus the protection of the integrated circuits with respect to electrostatic discharges. This task is gathering in importance in the development process of integrated circuits with the continuous reduction of the structure widths in semiconductor technologies and the increasing sensitivity against electrostatic discharges resulting therefrom.

For the development of robust circuits it necessary to make concrete statements about the behaviour of the protection structures and the active circuit under stress caused by overvoltages already during the development.

ESD simulation methods offer the possibility to obtain predictions about the behaviour of circuits under ESD stress. In order to perform ESD circuit simulations specific ESD simulation models (compact models) are required for all components of the circuit, which precisely describe their behaviour under ESD stress. The generation of these compact models requires great effort for calibration and extraction of parameters.

In circuit simulations there is a requirement for as high a precision as possible.

In order to perform known methods of ESD circuit simulation all of the parasitic components are required, which have therefore previously been extracted from the physical layout data of the circuit. The simulation net list created thereby is accordingly large and includes, in addition to the actual circuit and the ESD protection structures, also parasitic components, frequently including an IC package and ESD test models. During the ESD circuit simulation this leads to extremely long simulation times even for powerful computer systems. Additional big issues of known ESD circuit simulations are convergence issues, e.g., caused by the large simulation net list and numerical instabilities that arise from the complex physical behaviour of devices in ESD discharge paths under ESD stress. Some known methods use specific methods for reducing the simulation net list. Practically realisable solutions for the ESD circuit simulation in the context of these techniques are substantially obtained only by reasonable simplifications. Semiconductor manufactures and research institutions are working on simulation methods for performing ESD circuit simulations.

Up to now no such method is supported in the design flow by CAD/CAM EDA development tools ESD experts already use a significant portion of their work time for the validation of circuits with respect to potential ESD weak spots. Circuit designer who are less experienced with respect to ESD issues may easily miss ESD weak spots. For this reason a smart system for validating an IC design in the design flow during the design phase of the semiconductor circuit is advantageous in order to limit the effort in complex circuits and concurrently reduce the failure rate caused by ESD. It is advantageous to perform this validation already as early as possible in the design stage. To this end, tools are available that operate on layout level, such as a layout ESD design checker developed by X-FAB or other solutions disclosed in the literature, which also operate on layout level or based on ESD circuit simulation and which offer a high degree of automation, which require, however, very high efforts in terms of circuit simulation and evaluation, as discussed above. Hence, a need exists for automating the method of validating ESD weak spots.

In view of this situation it is an object of the invention to enable an ESD check or validation as early as possible in the development stage with reduced effort and with high fault coverage.

According to the present invention the object is solved in one aspect by a method of testing the behaviour of a circuit during the design phase with respect to electrostatic discharges (claim 1). The method comprises a step of providing, in a data base, parameterised data that describe the behaviour in an electrostatic discharge for each circuit component used in the circuit. Moreover, circuit components are identified in a signal path to be tested with respect to electrostatic discharge and the parameterised data associated with the identified circuit components are retrieved from the database. Eventually, at least one parameter value characteristic for the behaviour in an electrostatic discharge is determined for the signal path to be tested by using the associated parameterised data.

Contrary to methods for ESD circuit simulation the claimed invention that is also referred to as ESD design checker follows a conceptually different approach of a circuit analysis. The aim is the determination of potential ESD weak spots at a time as early as possible in the circuit development.

To this end it is started from key parameters of the ESD current-voltage characteristic of the basic devices of a technology, with which the ESD behaviour of the devices is abstractly described. In the same way the ESD behaviour of complex ESD protective circuits—consisting of several basic devices—is described. ESD discharge are determined by means of these abstract descriptions of the ESD behaviour, which are stored in a technology specific database, and by using specific algorithms.

Due to the complexity of present integrated circuits a verification of a circuit design with respect to a correct implementation of the selected ESD protection concept with the ESD structures available in a technology is possible in an automated and efficient manner according to the invention.

The inventive concept does therefore not rely on an ESD circuit simulation by means of compact models, but relies on the analysis of the circuit, i.e., the circuit components provided for the circuit and their mutual electric connection(s), by considering the ESD behaviour of the individual devices or functional blocks of reduced size, without requiring a simulation of the circuit. The basis for this is the data for the characterizing of the ESD behaviour of the circuit components, which advantageously comprises all of the devices available in a technology (primitive devices).

In a further embodiment the at least one characterizing parameter value specifies a discharge strength between contacts of the circuit so that information about the ESD behaviour between any two contact pins of the circuit exposed to a high electrostatic voltage is immediately obtained. In this manner the circuit developer can quickly test "virtually" the response of the circuit on the basis of the circuit diagram and may adapt the circuit diagram by adding or modifying the ESD protection components.

In a further advantageous variant the at least one characterizing parameter value specifies the voltage and/or the current at a contact of the signal path to be tested. The output of this value also allows a virtual quantitative evaluation of the circuit, since the voltage arising during the discharge at the contact pin and the occurring discharge current allow a detailed understanding of the discharge process and also represent comparison values for a further verification of the signal path considered by an more detailed simulation on layout level or an experimental test. Advantageously, a discharge path for the signal path to be testes is illustratively shown, such that the ESD information is provided in a way that is efficiently manageable by the user.

In a further embodiment determining at least one characterizing parameter value comprises: determining one or more discharge paths by applying predefined analysis rules on the retrieved parameterised data. By implementing specific analysis rules it is possible to perform a desired modeling of the "objective" parameterised ESD data. For instance, based on the ESD data and by means of the predefined rules various ESD models, for example, the HBM (human body model) may be emulated, wherein it is also possible to switch between different analysis rules so that the same signal path can be evaluated differently, without requiring the application of different parameterised data.

In a further embodiment the method further comprises: selecting a discharge protection concept used in the circuit prior to determining the at least one characterizing parameter value. Due to this selection the automatic identification of circuit components used for the ESD protection can be enhanced.

To this end, in one embodiment it is distinguished between a protection concept for a discharge via contact pad(s) or directly at contact pins (of the circuit design) and alternatively a protection concept for discharge via supply line(s) or power rail(s) of the supply voltage (claim 7). The latter "supply lines" have ESD structures that are internally connected to the supply line(s) of the supply voltage(s). They may be distributed centrally or uniformly (claims 41 to 43)

In this manner it is possible during the circuit analysis to generally take into consideration the selected ESD protection concept, i.e., pad based or power rail based. This is specified by the user via the selection of power supply clamp structures (structures that connect a possible discharge path with the power rails during discharge) which are predefined or are configurable in their parameters, or which electrically connect the positive and negative supply voltage lines during discharge, and thus enable/define a potential discharge path via the lines of the supply voltage and in this way protect the circuit connected to the lines of the supply voltage with respect to overvoltage(s).

In a further embodiment the determining of the circuit components that are present in the signal path comprises: using parameterised circuit data that specifies the electric properties of the present circuit components and their connections to each other. With this type of identifying the circuit configuration an efficient connection to many existing systems for representing circuits at diagram level is achieved, since here the circuit components are compiled to a circuit via their electrical data and are combined to electrical functional blocks according to different levels of abstraction. Moreover, one embodiment is provided in which it is operated on these functional blocks in order to obtain a desired modification of the circuit such that parasitic effects can be taken into consideration, which are not reflected by the parasitic portions of the circuit components in the form of the parameterised data but which are introduced by layout specific or technology specific requirements. For example, expected line resistances in signal paths or bus resistances of the line routing of the supply voltage may be implemented into the circuit in the form of metal resistors, i.e., by using parameterised circuit data of metal resistors.

In one embodiment the parameterised circuit data are associated with the corresponding parameterised data in order to determine the at least one characterizing parameter value. By means of this association of the technology specific ESD data with the electrical circuit data thus the technology dependent ESD behaviour is "imprinted" into the circuit to be tested and may then be automatically analysed by using the associated data sets in this case the usage of additional circuit components, for example, the previously mentioned line resistors, a certain degree of technology dependency may be already imparted to the basic circuit in order to obtain even more authentic results without having to rely on complex circuit models.

In a further embodiment the method further comprises: testing the electrical parameters of a plurality of circuit components and combining these circuit components to an individual discharge protection component and associating the individual discharge protection component with the parameterised data "provided" (stored) in the database for this individual discharge protection component. In this way more complex ESD protection structures may automatically be identified and associated with the appropriate parameterised ESD data, if the testing of the electrical parameters indicates that the components match so as to emulate on circuit level the ESD behaviour of this complex protection component.

Advantageously a single discharge protection component (=ESD structure) is formed by a plurality of bipolar transistors and (at least) a high-voltage NMOS transistor.

In high-voltage applications an ESD protection circuit or such a component is formed of at least a high-voltage NMOS transistor—triggered by a respective gate bias voltage. Also several circuits that can be triggered and that include several high-voltage NMOS transistors may be used.

These circuits operate like trigger circuits (during ESD), which are formed of diodes or bipolar transistors, in combination with the high-voltage NMOS transistor. They are thus identified as such circuit structures and are accordingly treated as macro blocks having a respective snap-back characteristic. In this case, the parameters of the snap-back characteristic, e.g., trigger voltage and trigger current, are adapted to the respective circuit configuration.

In a further embodiment the parameterised data are determined, which describe the behaviour of the circuit component resulting from the electrostatic discharge. This is achieved by injecting "short" current pulses into a circuit component and by evaluating of a current-voltage characteristic of the circuit component. By means of the current-voltage characteristic, thus, the ESD data may be obtained in a technology dependent manner. To this end, real device components may be used.

The short current pulses (impulses) may be injected with a time interval of several 100 psec to several 100 nsec with an amount of current of up to 30 A (claim 13). By means of these current pulses the real conditions during electrostatic discharge are emulated with sufficient precision, wherein the obtained parameters may be stored as corresponding ESD data in a data base by adaptation to various models such that the analysis may be performed on the basis of simplified rules.

Since the current pulses are short, in particular as impulses having a duration of preferably less than 500 nsec, in particular in the range of several 100 psec to 100 nsec, the real situation may be emulated. Real conditions are encountered during an ESD event in the integrated circuit.

Since the current pulses are injected with a current of less than 30 A, in particular in the range of 1 A to 10 A, also with respect to the current real conditions may be emulated. Advantageously, square pulses may be used. They can be readily reproduced. In other cases the response data is used without any further manipulation and a possibly desired adaptation to different ESD models is achieved by implementing appropriate evaluation rules and algorithms, as is described above.

In one embodiment sections of the current-voltage characteristic are linearised in order to determine the characteristic data. In this way the behaviour of, in particular, MOS transistors may be efficiently represented upon occurrence of ESD.

In one embodiment the parameterised data comprises a first data set representing a first production technology and a second data set representing a second, different production technology. By providing ESD data for different production technologies a superior flexibility is achieved in testing various circuits, since the different technologies—i.e., the critical dimensions of devices in the integrated circuit chip, etc.—are immediately retrievable from the database. In this case the appropriate data set may be automatically retrieved and used for the ESD test by indication of the desired technology.

In one embodiment the circuit represents the design of a complete integrated circuit. By analysing the ESD behaviour of individual circuit components and using complex compact models, thus even a very complex circuit of a complete IC may be tested in a time efficient manner and may possibly be modified.

According to another aspect the above-indicated object is solved by a system for testing the behaviour of a circuit with respect to electrostatic discharge at the design stage (claim 17). To this end, the system comprises a database that includes, for each circuit component of the circuit, parameterised data that characterises the behaviour of each circuit component upon injecting a (short) current pulse. A function module is provided for identifying circuit components on the basis of parameterised circuit data that describe the electrical characteristics of the circuit components used in the circuit and their electrical interaction with each other. The system further comprises an analysis module operatively connected to the function module and being configured to retrieve the parameterised data for the circuit components of the circuit from the database, to associate the data with the parameterised circuit data and to determine from the associated parameterised data by means of predefined rules a parameter value that is characteristic for the behaviour during electrostatic discharge.

Due to this configuration of the system for testing the ESD behaviour at circuit level, which may be referred to as an ESD design checker, technology dependent ESD data are provided in the database and associated with electrical data that specify the circuit configuration. This electrical data may or may not depend on the technology (preferably technology-independent). Hence, the basic circuit diagram of the circuit to be verified may be recorded automatically at a desired level of abstraction, e.g., functional blocks down to the transistors level, and may be associated with an ESD behaviour via the parameterised ESD data such that the ESD behaviour may then be analysed with respect to the circuit topology. Complex simulations at layout level are not required.

In a further embodiment the system further comprises a user interface that is configured to select, upon user request, at least one or more signal paths to be tested in the circuit such that a simple and intuitive handling of the system is achieved.

Further selection options provided by the user interface are
an ESD test voltage and/or
an ESD test model.

The user interface may also provide
ESD protection elements of the supply line, i.e., from predefined macro blocks
Proprietary macro blocks for protecting the supply line(s).

In a further embodiment an illustrating display unit is provided that is configured to display at least one characteristic parameter value, thereby enabling a fast and efficient perception for a user.

According to a further aspect of the invention the above-identified object is solved by a method of testing the behaviour of circuit with respect to electrostatic discharge during the design stage (claim 32). Prior to establishing a layout of the electronic circuit (specifies the design stage) several discharge paths are determined for the assuming case of the occurrence of an ESD discharge at a selected (first) contact on the basis of a circuit diagram of the electronic circuit. An ESD discharge path having a minimum resistance is selected from the several discharge paths. This is accomplished by using stored current-voltage characteristics for circuit elements and leads to the exclusion of at least one (or more) non-relevant discharge paths. They have greater values compared to the minimum resistance.

The circuit elements are present in several discharge paths. The current-voltage characteristics, for example, according to FIGS. 2a, 2b, 4a, 4b, are stored in a database.

Once the ESD path having the minimum resistance has been determined, this ESD path may be made visible (may be displayed), for instance according to FIG. 4d. It is that current path that has the minimum resistance (with respect to the first contact).

Other contacts may follow accordingly. A conductive pad, in particular a pin, may be used as a contact.

The system and the method for testing the ESD behaviour automatically verifies the circuit at circuit level by providing technology-specific ESD data in a database for all components provided in the circuit and using the ESD data for analysing the ESD behaviour, without requiring complex circuit simulations. Any simulations based on, e.g., front end and back end data by using "parasites" in the layout (parasitic components in the layout) are not necessary.

Further advantageous embodiments (examples) are referred to in the description. With reference to the drawings further embodiments will now be described in more detail.

Figure 1A:
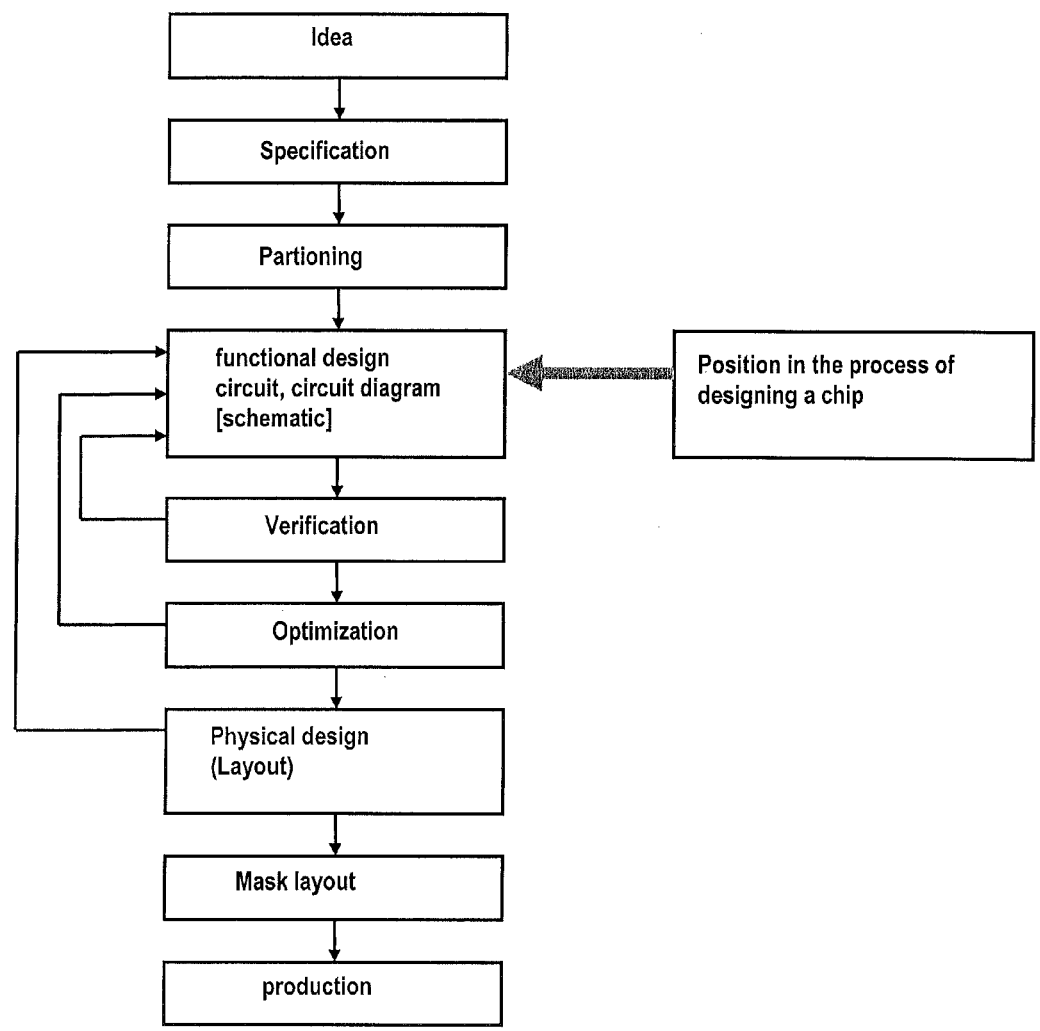
FIG. 1a is a schematic of the flow of development for the fabrication of an integrated circuit including an evaluation of the ESD characteristics, wherein this evaluation may be made in an early phase (prior to establishing a physical layout).
Figure 1B:
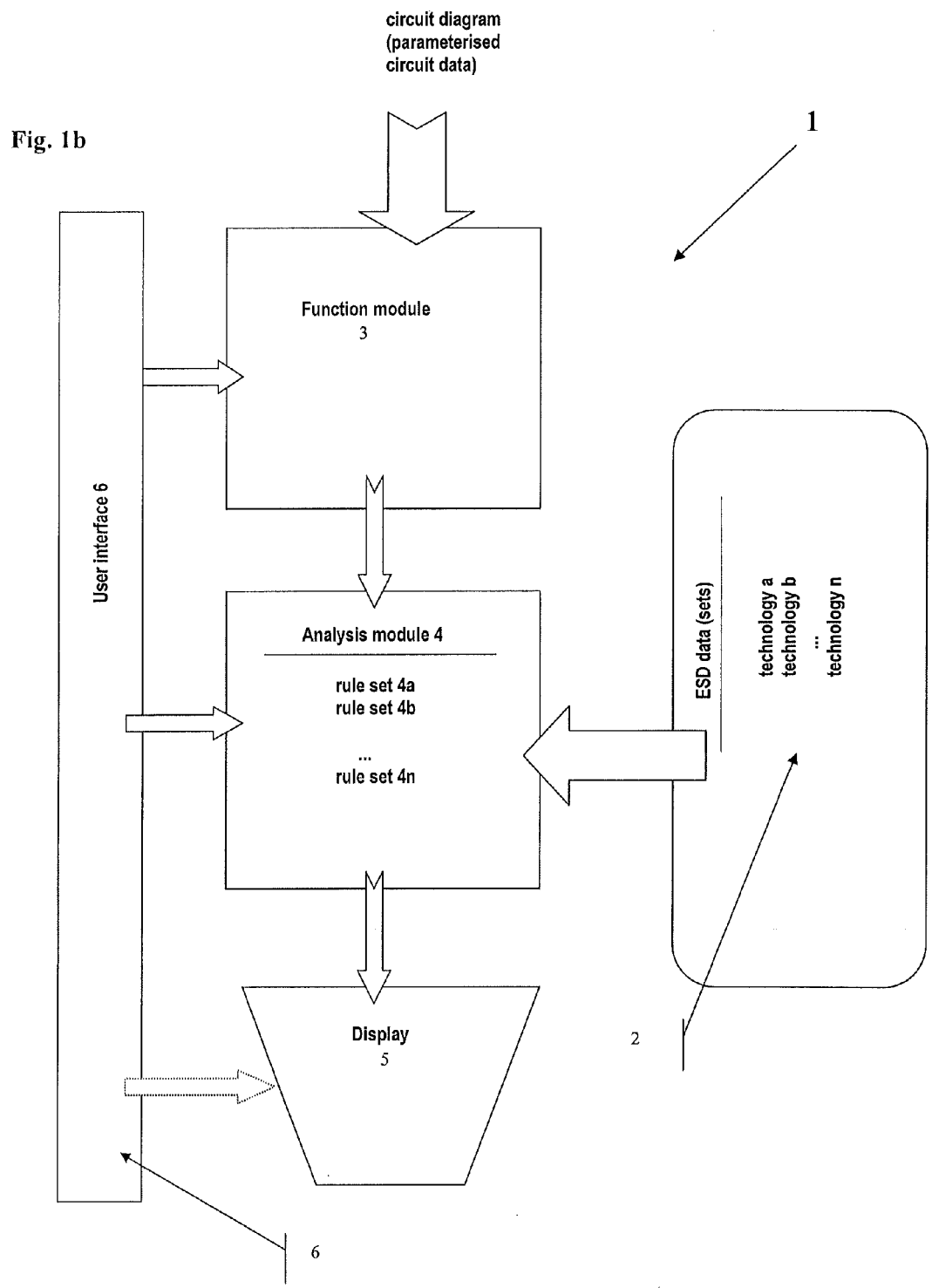
FIG. 1b is a schematic view of a system 1 for testing or checking the ESD behaviour at circuit level (ESD design checker) according to an illustrative embodiment.
Figure 4A:
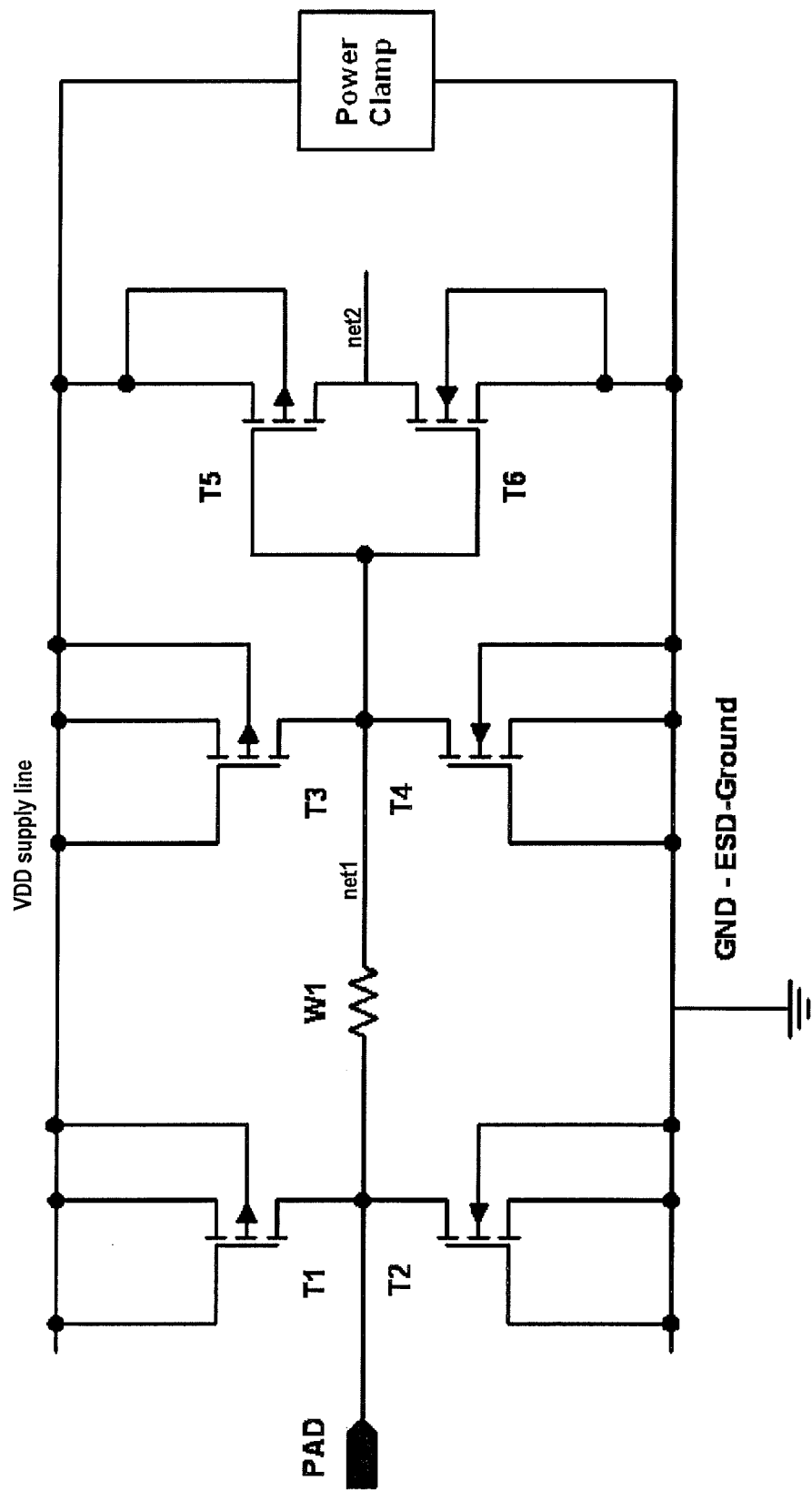
FIG. 4a shows a circuit diagram of a circuit that is verified with respect to the ESD behaviour according to an embodiment.
Figure 4B:
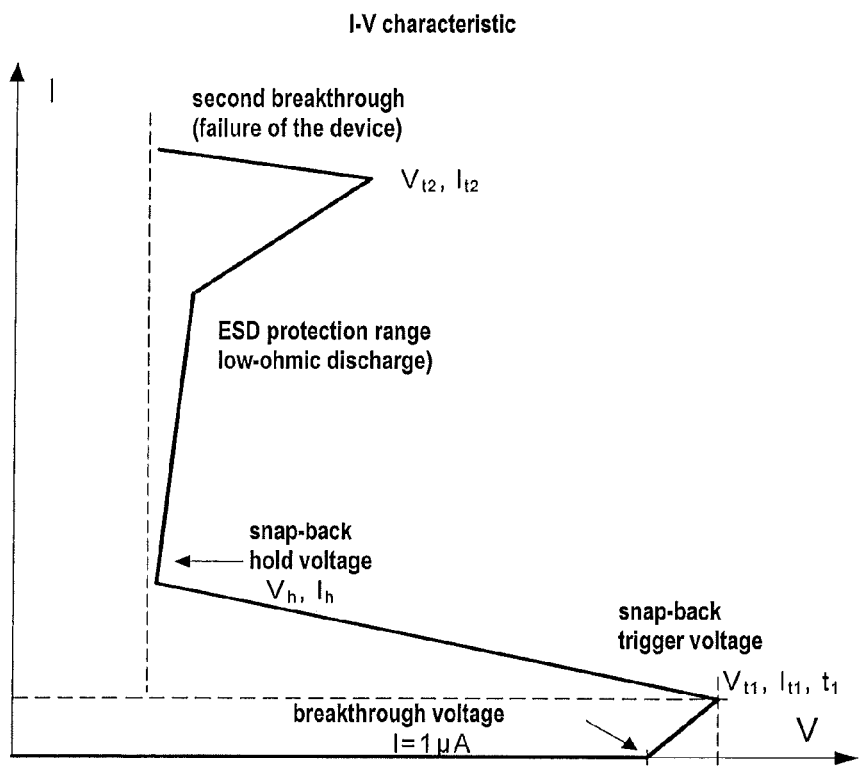
Figure 4C:
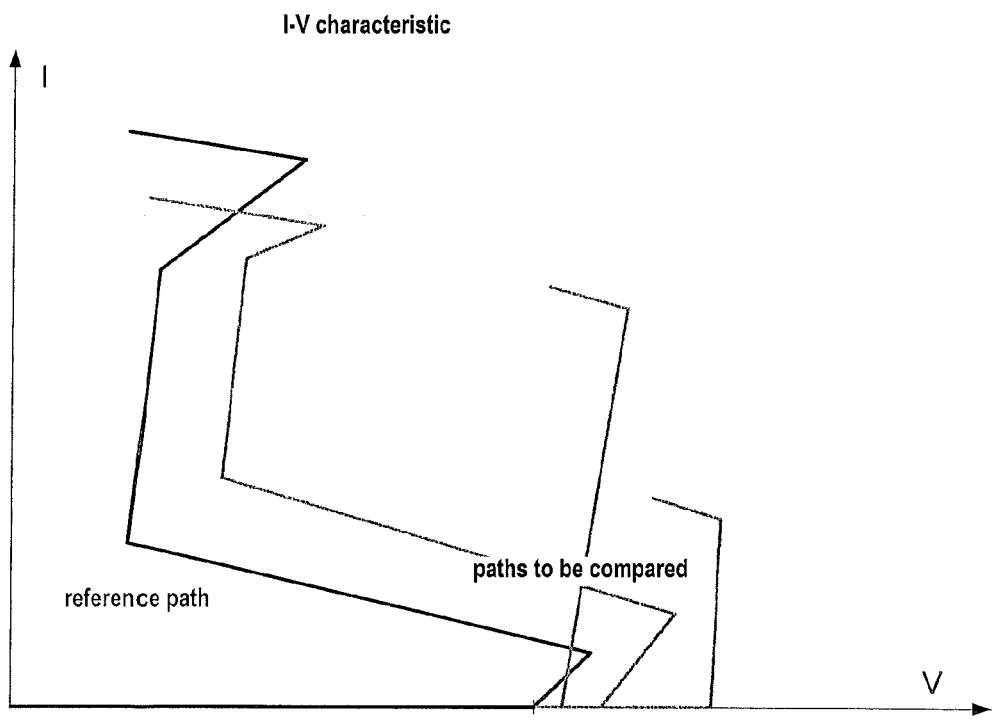
Figure 4D:
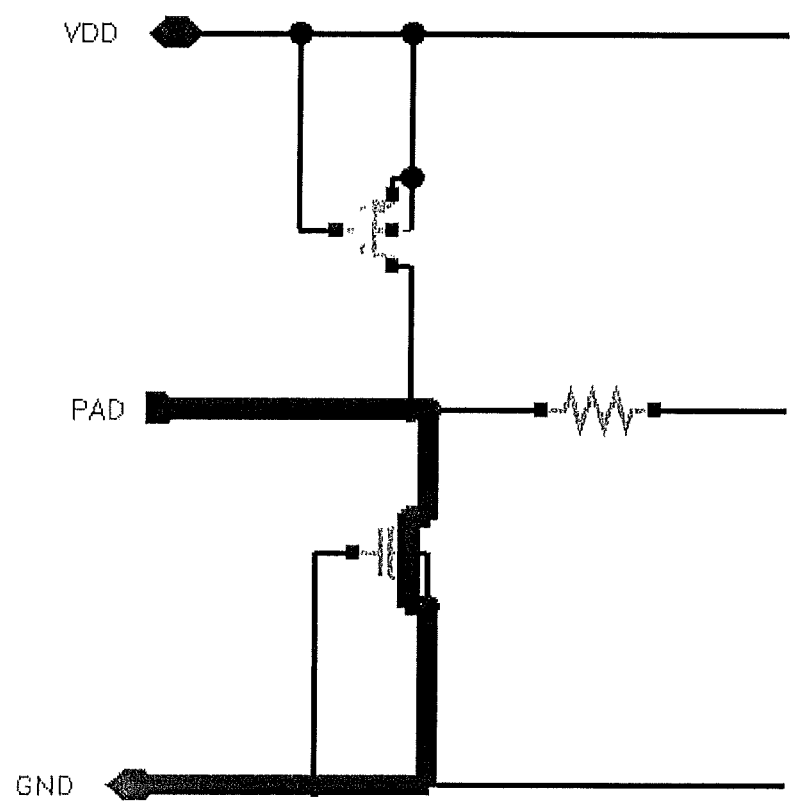

FIG. 4b to
FIG. 4d schematically show various steps in an illustrative method in order to clarify the operation of the system 1 from FIG. 1b.

FIG. 1a shows a schematic flow that represents the flow of a development beginning from the "idea" up to the fabrication of an integrated circuit ("circuit"), wherein it may seen, at which point in time ("position") of the development the examples are to be placed.

As shown, after a basic "idea" (the basic desired function of the circuit) a specification is established, in which the desired properties of the circuit are quantitatively summarized. Thereafter, an appropriate partition is established in order to group the required functions into appropriate function groups. Next, a functional design is made, i.e., a concrete circuit concept, in the form of a circuit diagram, etc. This concept is subjected to verification with respect to the desired functions, wherein corresponding optimisations are then performed. Based on the optimisation a physical design of the circuit, i.e., a plan of a concrete realization in a semiconductor chip, may then be established.

As shown, the steps of establishing the design, of verifying, of optimising and of establishing the layout are performed repeatedly, since these steps interact with each other. In this case the more the development flow has advanced the greater is the effort for each further modification.

After the layout the corresponding lithography mask are fabricated and based on this mask set the actual production process is performed by using a technology that has been taken into consideration during the development.

As already discussed above, the entire process prior to the actual production may be cost and time consuming and may thus be critical for the economic success of the device (integrated circuit). A thorough evaluation of, in particular, the ESD behaviour is an essential phase in the development of the integrated circuit, wherein thus a corresponding estimation is possible in an early phase.

As shown, an evaluation is made possible based on the functional design such that ESD caused requirements can already be taken into consideration with a high degree of coverage prior to establishing the physical layout.

There is provided an improvement relative to known methods in that a circuit can be analysed before a layout is established. This is possible, because circuit data from the circuit diagram (schematic) and not layout data are used as a basis. There is no need to provide a completed chip with layout (prior art) as a data source, but rather a circuit schematic or diagram even in a non-complete state may be used, Hence, the circuit is tested or checked in the design stage.

The circuit diagram thus contains at least one component up to a complex circuit design (completed chip), however without containing the layout.

FIG. 1b schematically shows a system 1 for testing the behaviour of a circuit (circuit data from a circuit diagram) during an electrostatic discharge, which is also referred to as an "ESD design checker". The system 1 comprises a database 2 that stores one or more parameterised data sets $2a, \ldots, 2n$ each of which describes the ESD behaviour of at least one circuit component according to a specified technology.

Advantageously, each data set $2a, \ldots, 2n$ is a "complete" data set in the sense that each circuit component contained in a circuit to be tested is also represented by its ESD parameters in the form of threshold values, etc.

The parameterised data for the ESD behaviour may be obtained by measurement from appropriately shaped stimulation current pulses by analysing the response. Also, the current-voltage characteristic of devices may be used in the form of an appropriate parameterisation, as will be explained in more detail for MOS transistors, cf. FIGS. 2a, 2b.

The devices including their parasitic components are taken into consideration in the individual data sets. Other parasitic components that result from the layout by combining basic or primitive devices may be taken into consideration in the form of, e.g., expected line resistances in signal paths or bus resistances of the power supply routing by metal resistors. The parameterised ESD characteristics in the form of the data sets $2a, \ldots, 2n$ thus enclose the ESD behaviour of simple PN junctions and resistors, the behaviour of gate oxides and a complex snap-back behaviour (as current-voltage characteristic) of the parasitic components of a MOS transistors.

By grouping all of the technology specific data in the data base 2 the system 1 (ESD design checker) is technology-independent and may be used in the context of other technologies, if several data sets $2a, \ldots, 2n$ are used.

The system 1 further comprises a function module 3 that is configured to automatically record the functional arrangement of circuit components, wherein this may be accomplished by parameterised electrical circuit data that represents the "circuit diagram" of the circuit, i.e., the components and their electrical connection to each other. For example, the corresponding data may be taken from the "schematic" of an appropriate platform, e.g., the platform "Cadence". This will be described in more detail later on in an example for the operation of the system 1.

There is provided an analysis module 4 that is connected to the function module 3 and the database 2. In the analysis module 4 an association is made of the electrical data representing the circuit, which data are provided from the function module 3, with the ESD data $2a, \ldots, 2n$ retrieved from the database 2, wherein that data set is used that is required for the respective technology, if several technologies, i.e., several data sets, are present in the database 2. By means of this association the individual circuit components as identified by the function module 3 are endowed with a technology specific ESD behaviour that is analysed for the circuit as a whole or for desired signal paths by the module 4. The analysis module 4 may feed back information to the function module 3, when certain discharge paths are determined that have to excluded from further analysis, as is also explained later on in a concrete example for describing the operation of the system. In this manner, the function module 3 is informed about which discharge paths are still to be checked.

Appropriate analysis rules are used. By means of the implemented rules probable ESD discharge paths are determined, without requiring an ESD circuit simulation and compact models. For example, the implemented rules may effect a differentiation between "regular" circuit components and ESD protection structures.

High-voltage (HV) applications partially use ESD protection circuits including gate bias-triggered HV NMOS transistors, or the connection of HV NMOS transistors under ESD stress conditions may result to a gate voltage that may have a significant influence on the their ESD behaviour.

In one embodiment the analysis module 4 is configured to identify such circuit structures and treat them accordingly as macro block having a modified ESD characteristic, in particular a specific snap-back characteristic. Other rules may include, for instance, the determination of potential discharge paths and the selection of one or more discharge paths having the lowest voltage strength and/or current strength as probable discharge paths.

In one embodiment several different rule sets $4a, \ldots, 4n$ are implemented, which may be selected according to requirements. The individual rule sets may hereby lead to different analysis results such that a more general assessment of the ESD behaviour of the same circuit is possible. For instance, the different rule sets $4a, \ldots, 4n$ may adapted to different ESD models in order to allow to evaluate the behaviour with respect to different ESD situations with the respective same data set $2a, \ldots, 2n$.

In this was it is possible to perform a "virtual" ESD test between any contact or pin combinations for a single circuit or a complete IC having a complex hierarchy. The outputting of the result of the ESD analysis of the circuit may be accomplished graphically by marking the determined current path as well as by outputting the calculated ESD strength as an example of the parameter characterising the ESD behaviour for the selected pin combination.

To this end, a display unit 5 is provided that is at least connected to the analysis module 4. As a further parameter value the voltage at the IC pin and the ESD discharge current may be output. In this case a communication with the system 1 may be implemented via a user interface 6 in order to select, for instance, an appropriate rule set $4a, \ldots, 4n$, if different rule sets are implemented, or to select a specific technology, i.e., the data set $2a, \ldots, 2n$. Also, it may be communicated with the function module 3, if, for example, the circuit diagram is to be modified, in order to, for instance, insert protection components or modify them, or to take into consideration parasitic technology dependent effects in the form of additional resistors. After identifying probable ESD weak spots it is possible for the circuit designer to test different solutions for enhancing the ESD strength experimentally or virtually.

During the circuit analysis preferably the selected ESD protection concept, pad based or power rail based, is taken into account. This is specified by the user via the interface 6 by selecting power supply clamp structures that may be predefined or may be modified in their parameters.

In the pad based ESD protection bi-directional protection structures are used that drain off the discharge. Preferably, devices having a deep snap-back characteristic are used as protection structures. For a combination of components having a deep snap-back characteristic and similar trigger behaviour by applying a respective rule set the analysis module 4 determines the critical ESD path that may occur upon triggering of the component having the lowest ESD strength. For any components that meet the requirement for a uniform triggering, $V_{t1} < V_{t2}$, the analysis module 4 may take into account a multiple triggering when determining the ESD strength.

According to another rule set the rail based ESD protection is based on the fact that in this case forward-biased diodes are used for discharging ESD pulses via the supply voltage lines in combination with power supply clamps, i.e., components for connecting the discharge path with the supply voltage lines. In this case, the ESD behaviour is substantially determined by the series resistance of the diodes, the turn-on resistance of the power clamps, for instance, of the voltage limiter (such as diodes) and the parasitic resistance of the supply voltage lines. The "virtual" EST test requires the definition of the parameters of the power clamp or clamp device by means of the data sets 2a, . . . , 2n. For the diodes an estimation of the ESD behaviour is made by means of the specified parameters, such as area, perimeter.

Figure 2A:
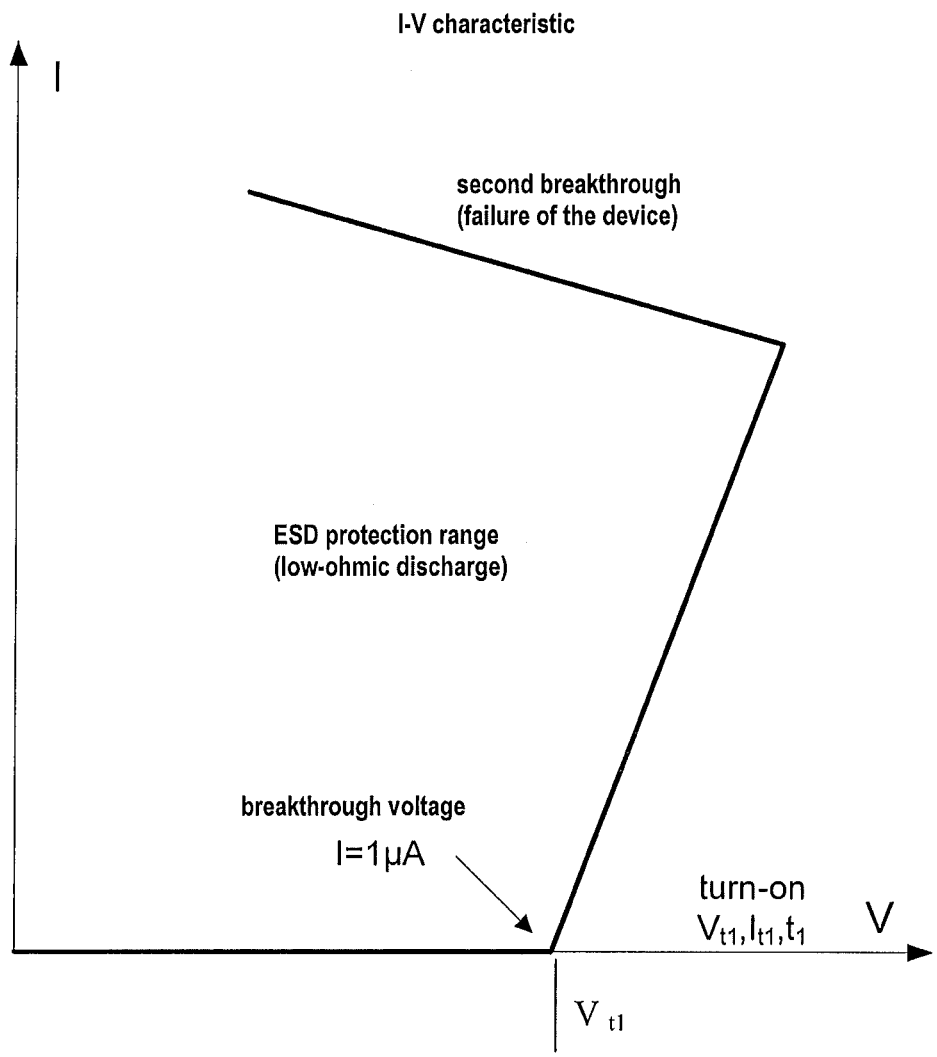
FIG. 2a is a current-voltage characteristic of a PMOS transistor in linearised form, as may be used for obtaining the parameterised ESD data.
Figure 2B:
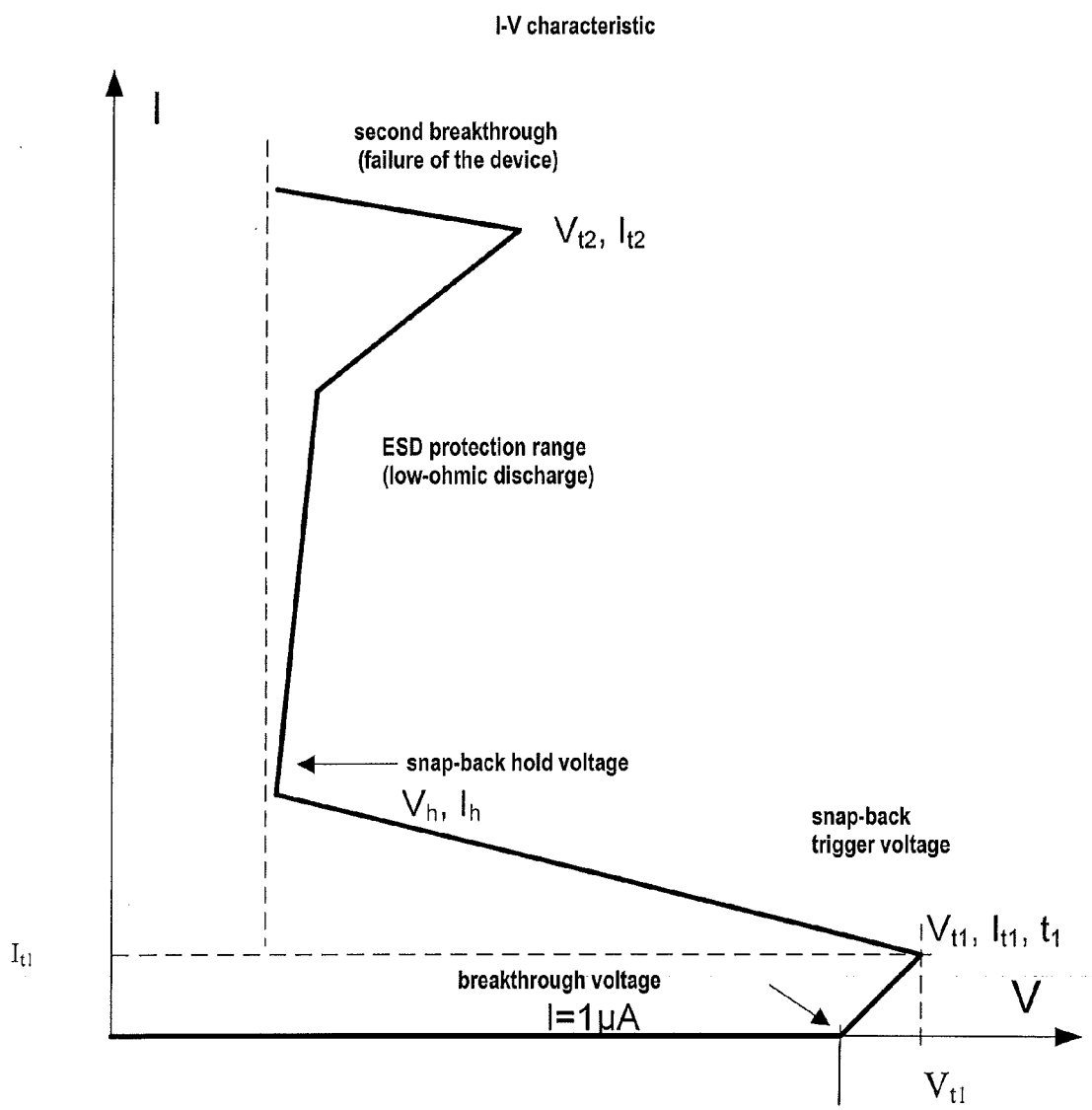
FIG. 2b is a current-voltage characteristic of an NMOS transistor in linearised form, as may be used for obtaining the parameterised ESD data.

With reference to FIGS. 2a and 2b a weak "snap-back" behaviour according to FIG. 2a and a pronounced snap-back behaviour according to FIG. 2b in MOS transistors are discussed.

MOS transistors typically have a snap-back behaviour under ESD stress: upon occurrence of a high voltage an avalanche breakthrough occurs at a PN junction, thereby turning on and holding in an on-state a parasitic bipolar transistor formed by the source, drain and the substrate. It may be distinguished between a weak snap-back in FIG. 2a, as typically occurs in PMOS transistors, and a deep snap-back of NMOS transistors in FIG. 2b.

As is shown in FIG. 2a, a step-like change of the resistance occurs at a trigger voltage $V_{t1}$ (switching point $V_{t1}, I_{t1}$) for the PMOS transistors such that this low-ohmic range may be used for draining off of discharge currents. The second breakthrough occurs at a higher voltage $V_{t2}$, which results in the destruction of the device and which has thus to be avoided.

In FIG. 2b the deep snap-back behaviour of an NMOS transistor is shown, wherein after the first breakthrough the snap-back behaviour occurs at a slightly higher voltage at $V_{t1}$, $I_{t1}$, transiting into a very low-ohmic phase, followed by a phase of increased resistance, finally followed by the second breakthrough at $V_{t2}, I_{t2}$ that results in the destruction of the device.

In one embodiment this behaviour is section for section linearily approximated. To this end, parameters are the breakthrough voltage, the snap-back trigger voltage and current, the clamping voltage or hold voltage and the failure limit of the device as determined by the second breakthrough.

With reference to FIGS. 3a to 3e some embodiments of the system 1 and of the method of operating the same will be described.

As a first example a circuit for a mixed-signal design is used, i.e., a circuit including analog and digital circuit portions of a low voltage test chip, for instance using voltages of less than approximately 10 V, in 0.6 μm high-voltage CMOS technology. In the following there are considered two variants of this test chip with rail based and pad based ESD protection. Both variants use digital and analog standard library cells.

Figure 3A:
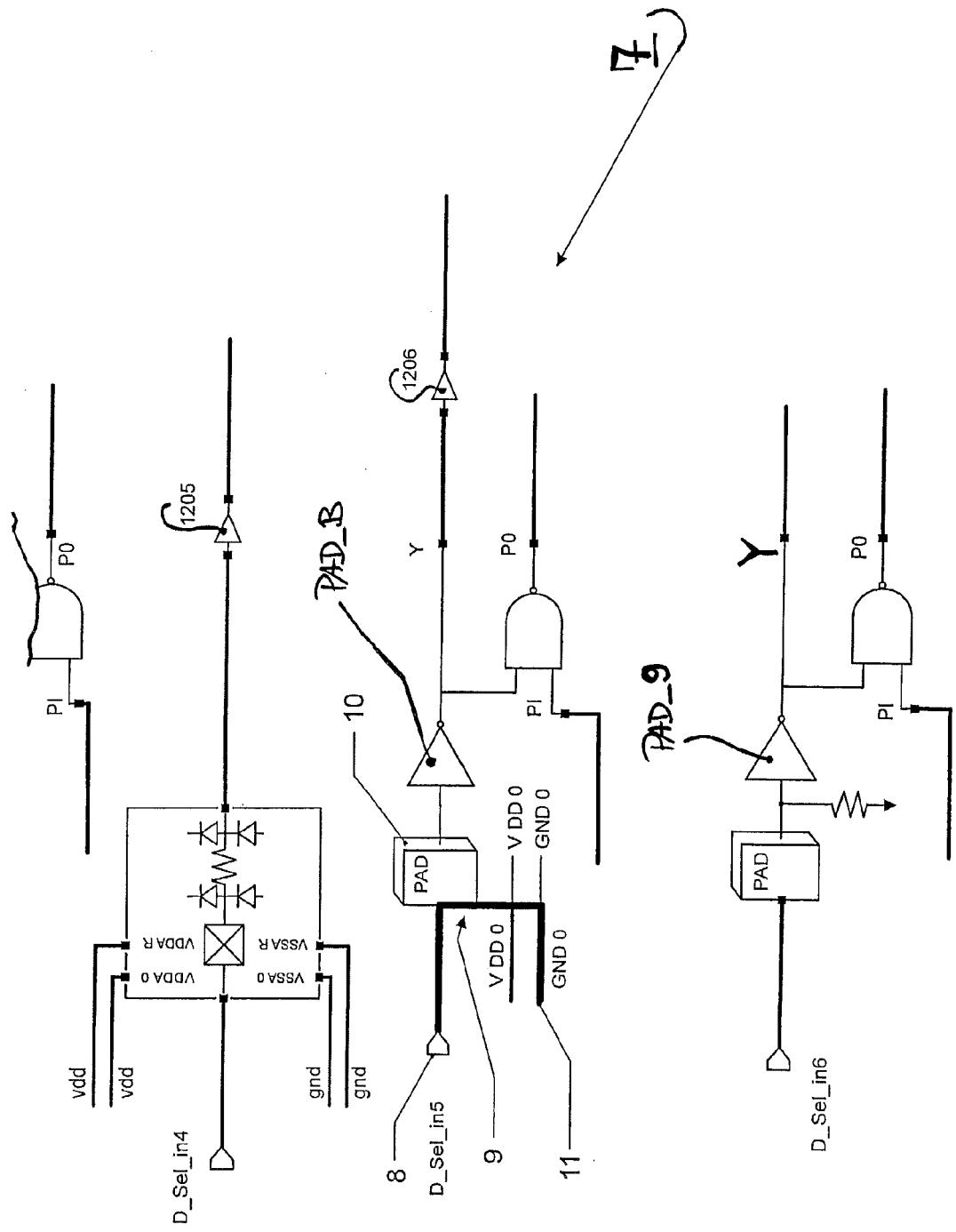
FIG. 3a to
FIG. 3e are schematic circuit diagrams including determined discharge paths for describing the functioning of the examples of the inventive system.

FIG. 3a shows a first example of a circuit 7 at the design stage, as it may, for instance, be displayed on the display unit 5 according to a more abstract circuit diagram level. For demonstrating the functional behaviour of the system 1 a digital input pin 8 is used that has implemented a pad based ESD protection concept such that a signal path 9 is to be analysed with respect to its ESD behaviour between a contact pad, e.g. as a pad 10, and a ground line 11.

Figure 3B:
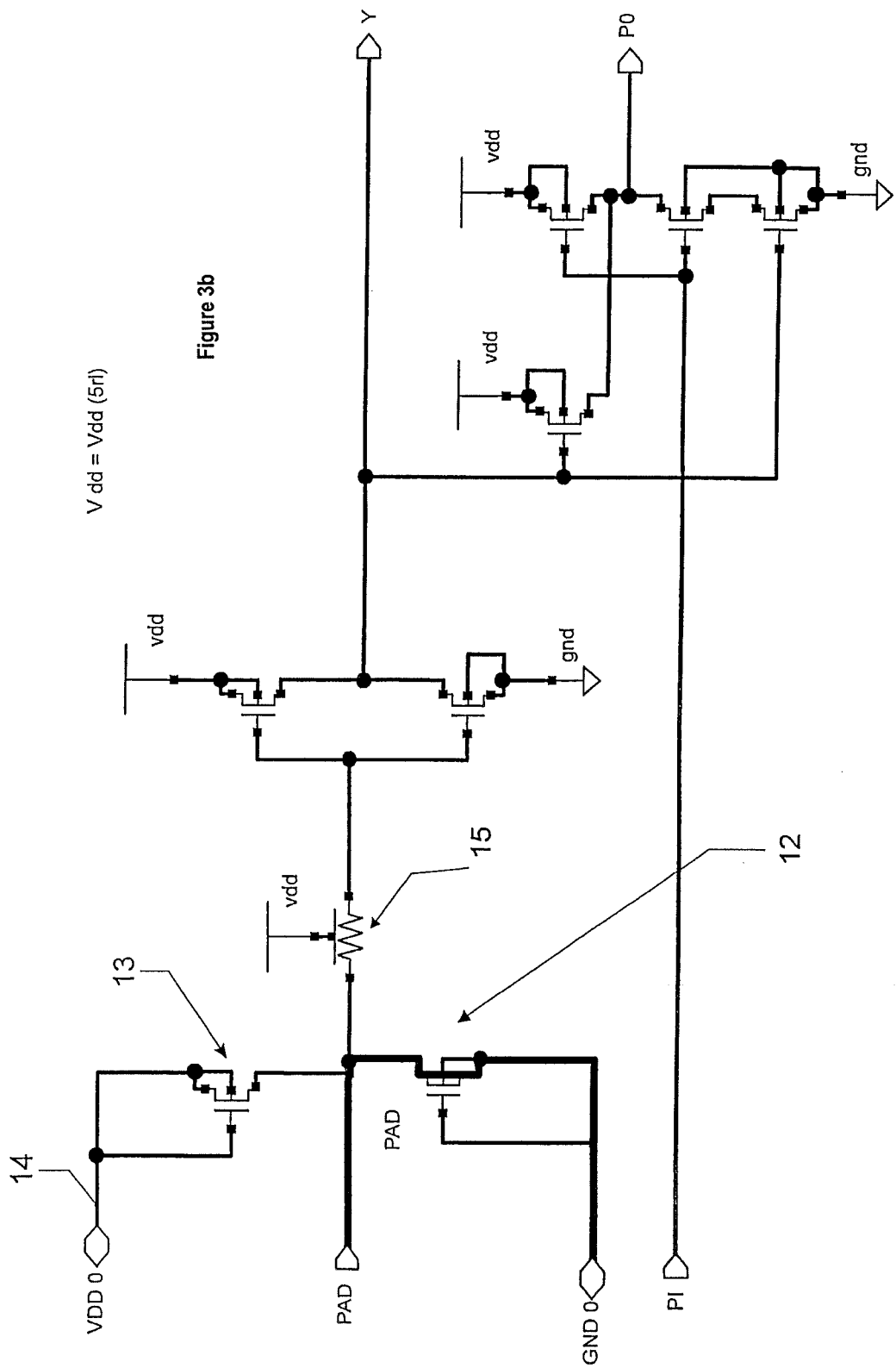

FIG. 3b shows the circuit 7 in a deeper level of abstraction, wherein the circuit is shown on transistor level. As a primary ESD protection structure an NMOS transistor 12 is used that has a gate tied to ground (ggNMOS). Similarly, a PMOS transistor 13 is provided, whose gate is connected to the positive supply line 14 (ggPMOS) and which forms a discharge path to the positive supply voltage that is, however, not considered in this example. The NMOS transistor 12 has, for instance, and ESD implantation for enhancing its ESD strength. In addition a series resistor 15 is used in the input circuit.

For the "virtual" ESD test using the system 1 the usually critical ESD discharge of positive polarity from the input pin to ground will be considered first. In this situation an ESD discharge path via the primary NMOS ESD transistor 12 to ground is determined by the system 1. A calculated pad voltage of 11.2 V indicates that the transistor 12 operates in the snap-back range, cf. FIG. 2b. The calculated ESD strength is 4.5 kV with an ESD discharge current of 3 A. For an ESD discharge of negative polarity also an ESD discharge path via the ESD NMOS 12 is determined, however, with significantly greater ESD strength or higher discharge current. The determined low pad voltage indicates that the parasitic drain-bulk diode of the NMOS is active. The size of the diode, which determines its ESD strength, is calculated according to the valid technology dependent design criteria with respect to the minimum distance of substrate and well contacts to source and drain diffusion regions of MOS transistors of the corresponding technology; from technology specific data that may be part of the data sets 2a, . . . , 2n or of the rule sets 4a, . . . , 4n, as well as from the layout parameters specified in the circuit diagram for the NMOS 12, which area available from the data fed to the function module. These results indicate that the positive pulse is the more critical case.

For the further illustration of the results the determined discharge path may be marked. This type of illustration allows tracking the discharge path through the hierarchy, starting from the top level, cf. FIG. 3a, down to the transistor level of FIG. 3b.

Figure 3C:
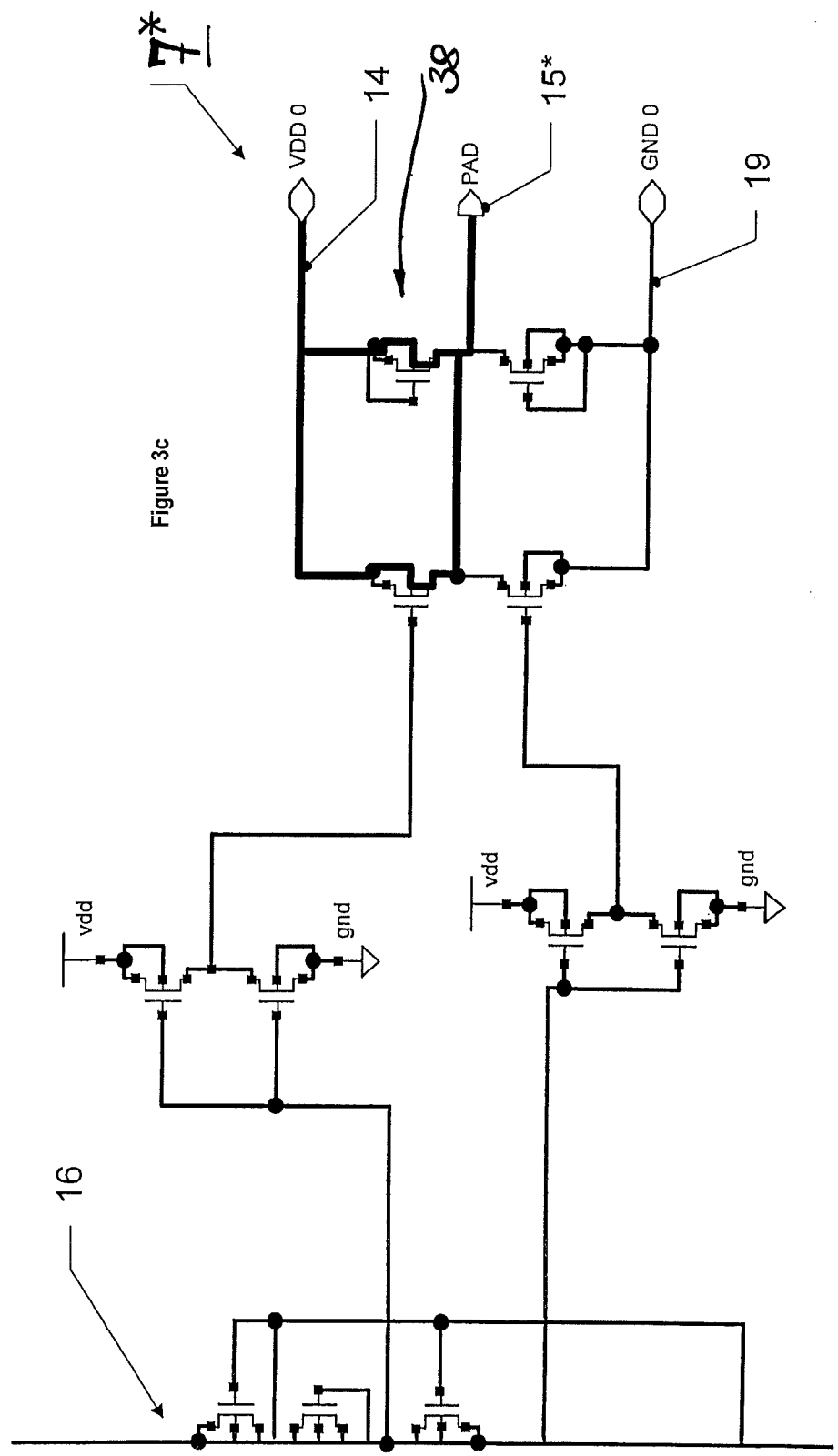

In FIG. 3c a discharge at an output pin 15\* (or pad) of a circuit 7\* is shown as a second example, wherein in this case the output pin is provided with a rail based ESD protection. 16 is a part of a tri-state control of an output driver. A triggered switch 38 is used as a power clamp or an ESD protection element of the supply lines 14, 19. This structure is defined by the user interface 6 as an ESD protection element of the supply lines. The user interface provides the possibility to define the ESD protection element of the supply line or to select from predefined recommended ESD protection elements.

In an ESD event this clamp circuit is already active at low voltages. In this way the breakthrough and the snap-back of the ESD sensitive NMOS transistors are avoided.

For the "virtual" test between the output pin 15\* and ground 19 it is determined that the discharge occurs via the two drain-bulk diodes to the power clamp. In this case an ESD strength of 5 kV according to the HBM (measurement) is determined by the system 1, In two more examples high-voltage devices and active clamp structures shall be discussed.

Figure 3D:
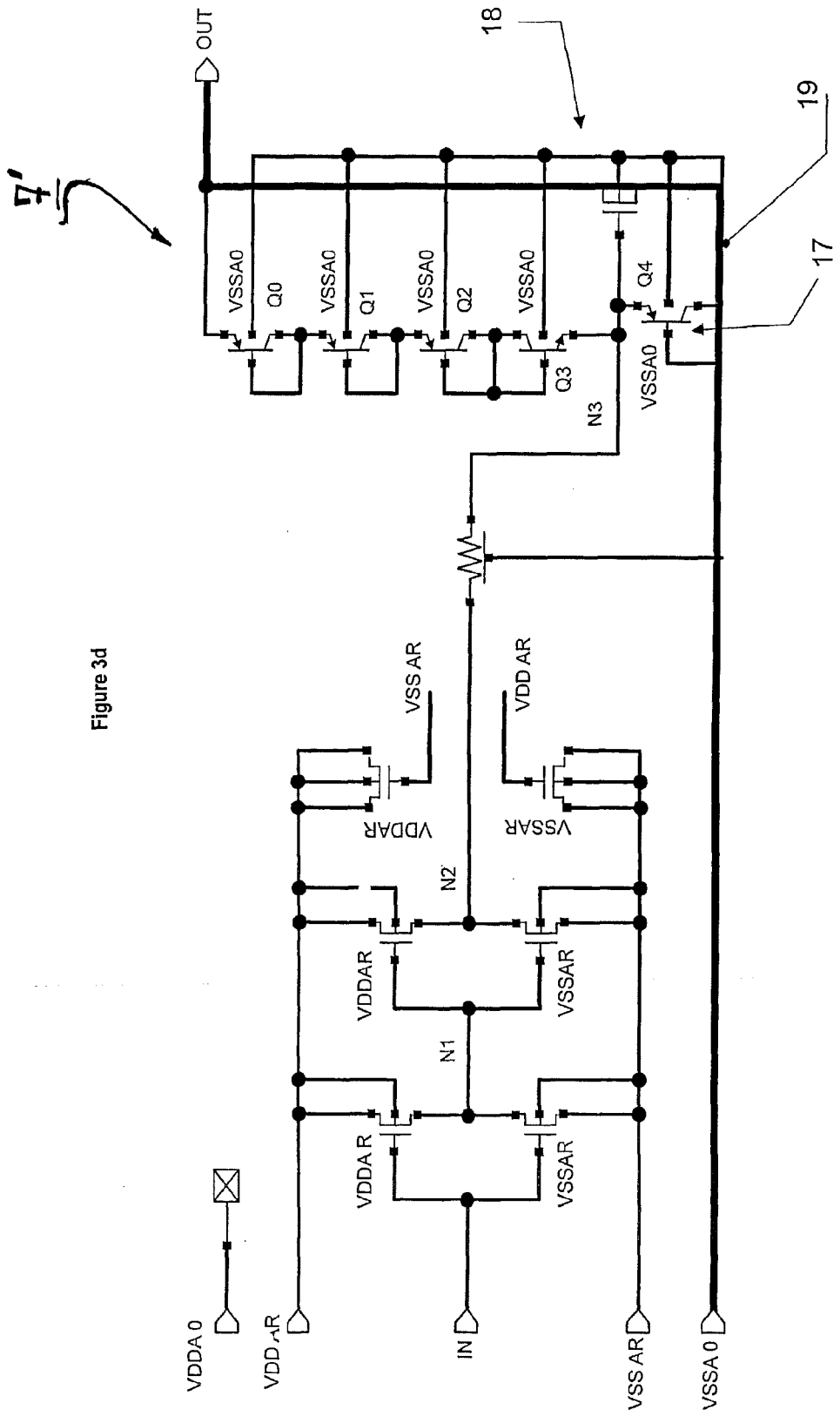

FIG. 3d shows a HV low side driver as circuit 7'. The circuit 7' serves for driving a ground-side power transistor 18. In this driver circuit 7' an active clamping is implemented so as to enable an ESD self protection.

A trigger circuit 17 depicting all of the bipolar transistors including those positioned between pad and gate of the HV NMOS 18 is provided. The entire circuit including BJT between drain and gate and gate and source is illustrated.

To this end a part of the ESD pulse of the trigger circuit 17 is used for driving the gate of the HV NMOS open drain transistor 18. In this case, the trigger circuit 17 essentially affects the ESD behaviour of the HV NMOS transistor 18. This is accordingly taken into account by the system 1 upon calculating the ESD strength.

The high-current behaviour of the system 1 of the clamp structure shown is hereby generally different from that of a simple high-voltage NMOS transistor. During the circuit analysis the system recognizes that the combination of bipolar transistors and the high-voltage NMOS transistor 18 is an active clamp structure. The corresponding components are combined to a macro block and are assigned an ESD behaviour stored in the database 2. Its breakthrough voltage is determined by the trigger circuit 17 comprised of the bipolar transistors indicated as Q0, Q1, Q2, Q3, Q4 and Q5. An ESD strength of more than 10 kV is determined for the clamp circuit by means of the system 1.

Measurements on a real setup of the structure resulted in an HBM current of more than 8 A without any measurable damage of the circuit. Thus, the results of the system 1 can be considered as confirmed.

Figure 3E:
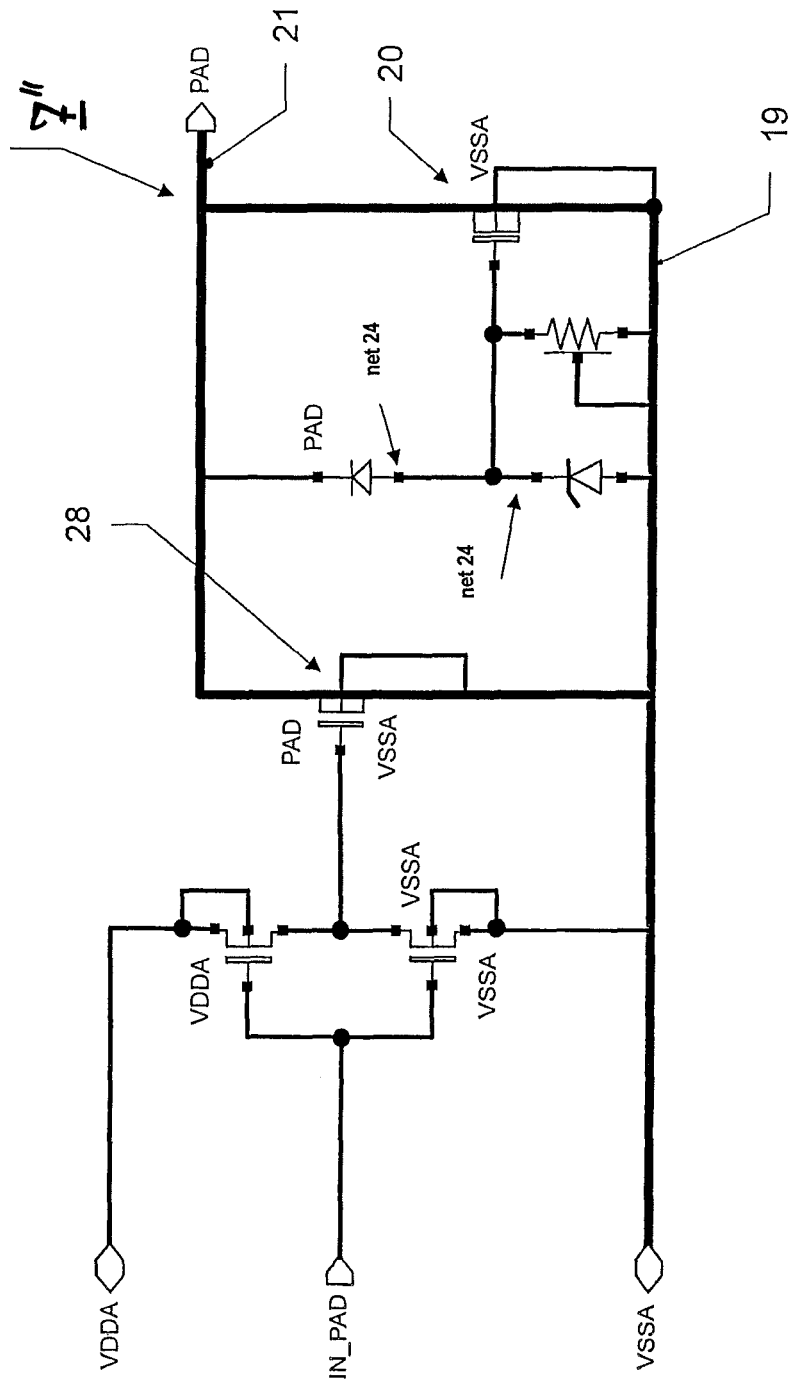

In FIG. 3e a further example 7" of the circuit 7 is shown, wherein the open drain driver 28 has no integrated trigger circuit. In this case an active clamp circuit 20 is used as ESD protection in parallel to the open drain driver 28.

Although the breakthrough voltage of the active clamp circuit 20 is set to a value sufficiently below the drain-source breakthrough voltage of the open drain output driver 28, the system 1 determines a merely very low ESD strength for a positive ESD stress from the output 21 (pad) to ground 19 (ground).

The open drain output driver 28 is identified as ESD weak spot. The active clamp circuit 20 does not provide sufficient ESD protection for the driver. As a reason for this the too high a trigger voltage of the active clamp circuit 20 is to be indicated. For this reason the ESD sensitive output transistor 28 is destroyed before the ESD protection circuit 20 is activated and limits the pad voltage to a sufficiently low value. By means of the ESD design checker this behaviour of the circuit may be already detected in the design phase at circuit level.

Thus, the system and the method enable an early estimation of the ESD strength of individual circuits and complete integrated circuits. With the system and method described above circuit designs can be verified fast with respect to proper implementation of various ESD protection concepts and potential ESD weak spots can be identified early already at circuit level. The ESD data may be obtained by appropriate measurement techniques, e.g., TLP (transmission line pulse), i.e., by injecting short high current pulses, or also by simulation.

In this case an estimation including quantitative information about the expected ESD strength is provided. The check is performed within the design environment and does not require any ESD circuit simulation using compact models. The system may be implemented in CAD platforms. For example, the system may be implemented in the platform Cadence DFII vie the programming language SKILL, wherein the analysis may be performed at the level of the circuit diagram (Cadence Schematic View).

In further embodiments of the system means for extracting circuit layouts may be provided so that in this case also an analysis of circuit layouts is possible.

EXAMPLES

Referring to the concrete circuit configuration of FIG. 4a and by means of the platform Cadence$^{Tr}$ examples are presented. For the first example there is used:

Cadence libraries (provide the circuit information)

User specified date, such as output pin or pad for the consideration and against which pin/pad it is to tested, or the indication of the physical connection (including the current-voltage behaviour) between the supply lines and the ESD ground, the polarity of the pulse or the ESD strength to be tested.

For the analysis and the calculation the current-voltage characteristic for each component of the technology to be used for the actual production are used. These values are obtained, as also previously discussed, from TLP measurements and DC characteristics. The characteristic for each component is stored in a database.

It is the object to determine the discharge path(s) of lowest resistance. To this end and ESD protection is implemented into a circuit.

The strategy of this example is the exclusion of physically non-relevant current paths. Therefore, in this example starting from the elected pin any connected components and their further connected nets are determined. If hierarchic instances are encountered, it will be stepped down to these instances. Current-voltage characteristics are stored in a database. Hence, for any possible discharge path the characteristic is known.

Next, the further connected nets are checked. In this case it is tested with respect to a contact to an ESD ground or a supply line. In case of a connection to the supply line user defined clamping structures are inserted.

If any paths to ESD ground exist, a "reference path" is determined. It goes without saying that if a single path is provided this path is the "reference path". This reference path describes an "active range" or a "window", in which other structures or paths may also be active so that a parallel breakthrough of several paths is possible. Thereafter the further paths are tested, whether their breakthrough voltages are within the active range ("window") of the reference structure, if not, the respective path does not need to be subjected to further analysis.

This method strongly reduces the number of potential paths and leads to a pronounced time saving.

If no reference path can be determined—that is the case when only internal connections are identified as further connected nets—no further reduction of the potential paths is possible. As a next step for each potential path the next component and its further connected net are determined. Subsequently, a new consideration of the reference path and a reduction are performed. This method is permanently performed until no further potential paths are present.

From the reference path and the paths that are also active in the region of the reference path those paths are determined that are actually relevant for the discharge. This is accomplished by an analysis of potential combinations of determined paths. The combination is made according to the order in which the paths will become active during an ESD event. To this end the current-voltage characteristic is used, which are available for each path.

In the circuit example of FIG. 4a for convenience only a discharge from IO (input/output) to ESD ground is considered. A test from IO to a supply line and from an IO to a further IO is also possible and is similar to the method considered in the example.

For the illustration of the step-wise determination of the critical paths or the paths across which the discharge occurs, the following entries are made by the user:
  connection between the ESD ground and the supply lines
  connection between the supply lines
  type of discharge
    IO to ESD ground—according to the example
    Generally: IO to supply line, IO to IO
  magnitude of the ESD strength to be tested
  "PAD" is the elected IO (input and/or output) in the example, e.g., as a pin to be connected therewith (contact pin).

The IO pad or pin selected by the user is the starting point. In a Cadence system the pin names correspond to the net names of the connected net. In this manner the selected pin determines the name of the output net.

In the first step of this example the instances connected to the output net, i.e., connected to the selected IO (pin or pad) are determined. The instances may be represented by basic or primitive devices, e.g., MOS or bipolar transistors, diodes, capacitors, resistors or by hierarchic instances. Hierarchic instances also consist of basic devices at the lowest level.

The occurrence of such hierarchic instances leads to a stepping down to the transistor level, at which only primitive basic devices are present.

The process of the stepping down is done in a step-wise manner, since be resolving of a hierarchic instance several internal paths may be obtained. The hierarchic instance is connected to the input pin via the input net. Upon stepping down the name of the input pin also represents the name of the internal input net. The determination of the instances in this new net is made in the same manner as at the top level.

For example, for the circuit of FIG. 4a, one obtains.
Determined instances: transistor T1, transistor T2 and resistor W1

| T1 | → Drain D |
| T2 | → Drain D |
| W1 | → MINUS M |

Each basic device comprises at least one physical path, i.e., each device has an input pin and at least one output pin. As an example a transistor should be considered that has the contacts for source, drain, gate and bulk and that comprises three potential paths, since one input and three further outputs are possible.

In a second step the physical paths are determined for each instance identified in the first step. To this end also the subsequent nets for the outputs of the previously determined devices or instances are determined. Each potential path and the associated output pins (IO pin) and the output net are identified. In the present example, this yields:

| path P1: T1 D | → S VDD |
| path P2: T1 D | → B VDD |
| path P3: T1 D | → G VDD |
| path P4: T2 D | → S GND |
| path P5: T2 D | → B GND |
| path P6: T2 D | → G GND |
| path P7: W1 M | → P (PLUS) net1. |

In the third step the respective physical behaviour is added to the determined devices in the form of a current-voltage characteristic. To this end the component data is used from the "schematic", such as W (transistor width) and L (transistor length) and the data from the database for $V_{t1}$, $V_h$, $V_{t2}$, $I_{t1}$, etc., as it is already discussed above in the context of FIG. 2b. For example, the following data may be retrieved:

| pathP1: T1 D | → S VDD, W = 720µ |
| path P2: T1 D | → B VDD, W = 720µ |
| path P3: T1 D | → G VDD, W = 720µ |
| path P4: T2 D | → S GND, W = 720µ |
| path P5: T2 D | → B GND, W = 720µ |
| path P6: T2 D | → G GND, W = 720µ |
| path P7: W1 M | → P net1, R = 100 Ohm |

The indication of the width W is made, for instance, as the number of transistor base cells (u) to be used. 720µ in the example indicates the "total width of the structure" (transistor).

In the fourth step the continuative nets of the components are checked with respect to the fact, whether they represent a previously defined supply line. If so, the respective clamping structure and its physical behaviour are added to the path, unless a check against exactly this supply line is made.

In this example this is case for the transistor T1, and thus this yields:

| path P1: T1 D | → S VDD | → CLAMP | → GND |
| path P2: T1 D | → B VDD | → CLAMP | → GND |
| path P3: T1 D | → G VDD | → CLAMP | → GND. |

In the fifth step the continuative nets of the various paths are further considered with respect to whether the continuative net represents the net against which the ESD discharge shall occur. Paths that meet this condition are checked with respect to their electrical behaviour. To this end paths are compared by using the active range as the criterion.

The path having the lowest upper limit of the active range is the reference path. If there is only one path, this path is the reference path.

In this example, the paths P1, P2, P3, P4, P5 and P6 are paths that reach the ESD ground. Hence, there are several paths from which the reference path is to be selected. In the present example the path P4, i.e., T2 D→S GND, that path that has the lowest upper limit of the breakthrough voltage, as is determined from the current-voltage characteristics. FIG. 4b is an example of such a characteristic.

Any further paths (complete or paths that have to be further considered) are tested with respect to whether their lower limit of the active range is below the upper limit of the reference path. If not, these paths can be neglected.

Are there no paths that meet this condition then a reference path cannot be determined and it is not possible to exclude any paths.

FIG. 4c schematically shows a corresponding comparison procedure of several current-voltage characteristics for excluding (non-relevant) discharge paths (current paths).

In the last example the paths P4, P1, P2 and P5 have been obtained, whereas P3 and P6 can be excluded. The path P7: W1 M→P Net1 is not excluded and requires further consideration.

In the next steps the next instance (step 6) and its continuative net (step 7) is determined for all paths that need to be further considered. The number of paths to be tested is thus dependent on the fact whether a reference path has been found.

The usage of a reference path and the analysis of the physical behaviour are aspects for the exclusion of non-relevant paths and thus a significant time saving.

After the previous method steps any possible paths have to further be analysed. In this case the determined continuative net for each path is a new start or output net. By analysing hierarchic data it is possible that the following cases may occur at the output net, a primitive device, a hierarchic instance or a pin.

In the two first cases the analysis is done as it is described above with reference to the first device. If there is a pin, and if the hierarchy level is not the top level, it has to be stepped up. In the next higher hierarchy level the net is further analysed. Also in this case three cases exist for the progression of paths. The end of this analysis is the determination of the next primitive device and its continuative net. Due to the different physical ways through a device also in this case new paths are obtained, wherein these paths are combined with the already determined respective path.

Thus, for the net 1 the following entries for the following instances (devices):

T3→D
T4→D
T5→Gate G
T6→Gate G

By means of these devices the following variants of paths are obtained:

| path P7: W1 M | → P Net1 T3 D | → S VDD |
| path P8: W1 M | → P Net1 T3 D | → B VDD |
| path P9: W1 M | → P Net1 T3 D | → G VDD |
| path P10: W1 M | → P Net1 T4 D | → S GND |
| path P11: W1 M | → P Net1 T4 D | → B GND |
| path P12: W1 M | → P Net1 T4 D | → G GND |
| path P13: W1 M | → P Net1 T5 G | → S VDD |
| path P14: W1 M | → P Net1 T5 G | → B VDD |
| path P15: W1 M | → P Net1 T5 G | → D Net2 |
| path P16: W1 M | → P Net1 T6 G | → S GND |
| path P17: W1 M | → P Net1 T6 G | → B GND |
| path P18: W1 M | → P Net1 T6 G | → D Net2 |

In the eighth step method steps are performed that are identical with the steps during the determination of the first device at the selected discharge pin.

Following thereto the current-voltage characteristics of the individual ways through the devices are added.

In the ninth step the continuative nets are analysed with respect to whether there is a line for the supply voltage or an ESD ground. Also the insertion of clamping structures is accomplished in this step.

If the continuative net is a supply line, then the clamping structure defined in advance is added to the path:

P7: W1 M→P Net1 T3 D→S VDD→CLAMP→GND
P8: W1 M→P Net1 T3 D→B VDD→CLAMP→GND
P9: W1 M→P Net1 T3 D→G VDD→CLAMP→GND
P13: W1 M→P Net1 T5 G→S VDD→CLAMP→GND
P14: W1 M→P Net1 T5 G→B VDD→CLAMP→GND.

In step 10 it is tested whether a new reference path exists and whether an exclusion may follow.

If there are there any paths after the exclusion procedure, then a further cycle of said method steps 6 to 10 is performed.

Here the list of paths that reach the ESD ground is obtained:
P7, P8, P9, P10, P11, P12, P13, P14, P16 and P17
reference path: path P4: T2 D→S GND result list:
P4, P1, P2, P5, P7, P8, P10, P11
connection list:
P3, P6, P9, P12, P13, P14, P16, P17, P15, P18

From the above 18 analysed paths are obtained and there are no further potential paths.

In step 11 the result list is evaluated. Paths are determined that are active so as to precisely drain off the desired ESD discharge, or paths are determined that have an ESD weakness so that the ESD discharge cannot be drained off.

For this method all of the paths of the result list are represented in a current-voltage diagram.

Beginning with the path (discharge path) that is firstly active it is determined step by step how high is the discharge current that can be drained off by this path until the next path becomes conductive.

If the discharge current is sufficiently high in order to drain off the ESD discharge, then the ESD discharge path is determined. In this case, the ESD test is passed. If the discharge current is less, then the next active path from the result list is taken into consideration in the analysis. This analysis is also performed until the next path becomes active.

This is repeated as long as either the test has been passed and the discharge can be drained off, or the test as been failed and all of the paths from the result list have been used in the analysis.

The determined paths for the discharge or the ESD weak spots are stored in the result list.

In the present example the path P4 is considered first:
Path P4: T2 D→S GND

This structure can drain off the discharge for the required ESD properties without the other potential paths.

In step 12 the results of the method are represented by outputting the result list graphically or as text, as is shown in FIG. 4d graphically.

In an alternative method as a further example of the method and the apparatus one begins with the premise to exclude physically non-relevant nets, as is described above.

Also in this case it may be started from FIG. 1a. It shows a flow scheme that represents the flow of the development until the production of an integrated circuit, wherein it is evident at which position of this development this example of the invention is to be placed.

The implementation of ESD protection for achieving the desired ESD strength is an important aspect in the development process of an IC and already affects its functional design. The basic concept upon implementing ESD protection in a circuit is the establishment of a low-ohmic discharge path parallel to the functional part of the circuit. This low-ohmic path is determined by a calculation that uses a sort of reference method.

Starting point of this example is the exclusion of physically non-relevant current paths. Starting from the selected pin (or path) all of the connected components and their continuative nets are hierarchically considered.

Current-voltage characteristics of all components of a technology associated with the determined or given circuit data (device and nets) provide the characteristic of all the components.

Associations of components that are provided between a pin (or pad) and the pin (or pad) against which it is tested (input/output pin [IO] against ESD ground, IO against supply voltage, IO 1 against IO 2), are used for a reference path contemplation and in order to minimise the computation complexity. Hence, by means of the reference path any dispensable paths are eliminated from the paths still to be considered. To this end an operating range of the reference structure is crucial.

The reference path and any paths that are active within its operating range are used for the determination of the actual discharge path(s). This is accomplished by analysing potential combinations of the determined paths. The combination is applied according to the order in which the paths become active. To this end a current-voltage characteristic is used, which is provided for each path. Also in this case FIGS. 2*a*, 2*b* are examples therefor.

Also this embodiment enables an evaluation of the ESD behaviour at the time of the functional design. Hence, also in this case circuit data from the circuit diagram or schematic is used. It is not necessary that a complete integrated circuit is provided as a circuit or as a layout; rather, even individual parts of the circuit may be tested with respect to potential ESD weak spots.

Starting point of a further example of the method and the system is the exclusion of physically non-relevant current paths.

In this case it is searched for the lowest resistance discharge path(s). In this method all of the connected components and their continuative nets are determined from a selected pin (or pad). If there are any hierarchic instances, i.e., subordinate combined partial circuits which are inserted into superordinate circuits—represented by a symbol—it is stepped down into these instances. Current-voltage characteristics for the encountered components are stored in a database (provided). Hence, the characteristic is known for any potential discharge path.

It follows the testing of the continuative nets. To this end it is tested with respect to a contact to an ESD ground or to a supply line. For a contact to the supply line user defined clamping structures are inserted. If there are any discharge paths to ESD ground then a reference path is determined. It describes a window (operating range) in which other structures or paths may be also active so that a parallel breakthrough of several discharge paths is possible. The further existing paths are then tested whether their breakthrough voltages are in the active range ("window") of the reference structure, If not, the respective path does not need to be subjected to further analysis.

The method strongly reduces the number of potential ESD discharge paths and leads to a significant time saving.

If no reference path can be determined (this is the case when only internal connections are found as continuative nets of the paths), then a reduction of the potential paths is not possible.

As a next step the next component and its continuative net are determined. Thereafter a further reference path contemplation and reduction is applied.

This method is continued until any potential paths for consideration do no longer exist.

From the reference path and those paths that are also active in its active range the paths actually relevant for the discharge are determined. This is accomplished by analysing potential combinations of the determined ESD current paths. The combination is applied in the order in which the discharge paths become active. To this end the current-voltage characteristic is used that is available for each path. Examples therefore are shown in FIGS. 2*a*, 2*b*.

What is claimed is:

1. A method of checking a behaviour of a circuit in a design stage that is prior to realising a physical layout of the circuit by using a computerised system, the method comprising the steps providing parameterised data in a database, the parameterised data describing the behaviour of said circuit in the design stage during electrostatic discharge and each circuit component used in the circuit is associated with a set of said parameterised data;

identifying circuit components in a signal path of the circuit for testing electrostatic discharge thereof by using parameterised circuit data specifying the electrical properties of the circuit components used in the circuit and their connections to each other;

retrieving the parameterised data associated with the identified circuit components from the database;

determining, by the computerised system, at least one parameter value for the signal path, the at least one parameter value characterising the behaviour of said circuit during electrostatic discharge by using the associated parameterised data; and combining several circuit components to a single discharge protection component and associating said single discharge protection component with the parameterised data stored in the database for said single discharge protection component.

2. The method of claim 1, wherein the single discharge protection component is formed by a clamp circuit including a trigger circuit.

3. A method of checking a behaviour of a circuit in a design stage that is prior to realising a physical layout of the circuit by using a computerised system, the method comprising the steps providing parameterised data in a database, the parameterised data describing the behaviour of said circuit in the design stage during electrostatic discharge, and each circuit component used in the circuit is associated with a set of said parameterised data, said parameterised data being obtained by injecting current pulses in a circuit component and by evaluating a current-voltage characteristic of the circuit component, said obtained parameterised data describing the behaviour of the circuit component occurring during electrostatic discharge;

identifying circuit components in a signal path of the circuit for testing electrostatic discharge thereof;

retrieving the parameterised data associated with the identified circuit components from the database; and determining, by the computerised system, at least one parameter value for the signal path, the at least one parameter value characterising the behaviour of said circuit during electrostatic discharge by using the associated parameterised data.

4. The method of claim 3, wherein the current pulses are injected as impulses having one of: a length of less than 500 nsec and an intensity of current of less than 30 A.

5. The method of claim 3, wherein sections in the current-voltage characteristic are linearised so as to determine the characteristic data.

6. A method of checking a behaviour of a circuit in a design stage that is prior to realising a physical layout of the circuit by using a computerised system, the method comprising the steps providing parameterised data in a database, the parameterised data describing the behaviour of said circuit in the design stage during electrostatic discharge, said design stage representing said circuit as a circuit diagram at a selectable level of abstraction of said circuit diagram, and each circuit component used in the circuit is associated with a set of said parameterised data;

identifying circuit components in a signal path of the circuit for testing electrostatic discharge thereof;

retrieving the parameterised data associated with the identified circuit components from the database; and determining, by the computerised system, at least one parameter value for the signal path, the at least one parameter value characterising the behaviour of said circuit during electrostatic discharge by using the associated parameterised data.

7. The method of claim 6, wherein the at least one characteristic parameter value indicates a discharge strength between contacts of the circuit.

8. The method of claim 6, wherein the at least one characteristic parameter value indicates one of a voltage and a current at a contact of the signal path.

9. The method of claim 6, further comprising representing or displaying a discharge path for the signal path.

10. The method of claim 6, wherein determining the at least one characteristic parameter value comprises: determining one or more discharge paths by applying predefined analysis rules to the retrieved parameterised data.

11. The method of claim 6, further comprising: selecting a discharge protection concept used in the circuit prior to determining the at least one characteristic parameter value.

12. The method of claim 11, wherein the discharge protection concept is selected from a protection concept for a discharge via contact pads.

13. The method of claim 6, wherein identifying the circuit components in the signal path comprises: using parameterised circuit data specifying the electrical properties of the circuit components used in the circuit and their connections to each other.

14. The method of claim 13, wherein the parameterised circuit data are associated with the associated parameterised data so as to determine the at least one characteristic parameter value.

15. The method of claim 13, further comprising: combining several circuit components to a single discharge protection component and associating said single discharge protection component with the parameterised data stored in the database for said single discharge protection component.

16. The method of claim 15, wherein the single discharge protection component is formed by a clamp circuit including a trigger circuit.

17. The method of claim 6, wherein parameterized data is obtained by injecting current pulses in a circuit component and by evaluating a current-voltage characteristic of the circuit component, wherein the parameterized data describes the behavior of the circuit component occurring during electrostatic discharge.

18. The method of claim 17, wherein the current pulses are injected as impulses having one of: a length of less than 500 nsec and an intensity of current of less than 30 A.

19. The method of claim 17, wherein sections in the current-voltage characteristic are linearized so as to determine the characteristic data.

20. The method of claim 6, wherein the parameterized data comprises a first data set representing a first manufacturing technology and a second data set representing a second different manufacturing technology.

* * * * *